United States Patent
Yamazaki et al.

(10) Patent No.: US 7,639,248 B2
(45) Date of Patent: *Dec. 29, 2009

(54) DISPLAY DEVICE AND ELECTRONIC DEVICE

(75) Inventors: Shunpei Yamazaki, Setagaya (JP); Jun Koyama, Atsugi (JP); Kazutaka Inukai, Atsugi (JP); Mitsuaki Osame, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 410 days.

This patent is subject to a terminal disclaimer.

(21) Appl. No.: 10/972,510

(22) Filed: Oct. 26, 2004

(65) Prior Publication Data

US 2005/0093802 A1    May 5, 2005

Related U.S. Application Data

(62) Division of application No. 09/922,715, filed on Aug. 7, 2001, now Pat. No. 6,825,820.

(30) Foreign Application Priority Data

Aug. 10, 2000 (JP) .............................. 2000-242718

(51) Int. Cl.
*G06F 3/038* (2006.01)
*G09G 5/00* (2006.01)

(52) U.S. Cl. ........................ 345/211; 345/76; 315/169.3

(58) Field of Classification Search ............... 345/76, 345/77, 82, 83, 87, 86, 206, 211, 75; 315/169.3; 313/498
See application file for complete search history.

(56) References Cited

U.S. PATENT DOCUMENTS

| | | | |
|---|---|---|---|
| 3,909,788 | A | 9/1975 | Kaelin et al. |
| 5,485,355 | A | 1/1996 | Voskoboinik et al. |
| 5,598,021 | A | 1/1997 | O et al. |
| 5,652,600 | A | 7/1997 | Khormaei et al. |
| 5,807,627 | A | 9/1998 | Friend et al. |
| 5,812,105 | A | 9/1998 | Van De Ven |
| 5,882,761 | A | 3/1999 | Kawami et al. |
| 5,990,629 | A | 11/1999 | Yamada et al. |
| 6,057,647 | A | 5/2000 | Kurosawa et al. |
| 6,147,667 | A | 11/2000 | Yamazaki et al. |
| 6,157,052 | A | 12/2000 | Kuge et al. |

(Continued)

FOREIGN PATENT DOCUMENTS

EP    0776147    5/1997

(Continued)

*Primary Examiner*—Chanh Nguyen
*Assistant Examiner*—William L Boddie
(74) *Attorney, Agent, or Firm*—Eric J. Robinson; Robinson Intellectual Property Law Office, P.C.

(57) ABSTRACT

A display device capable of displaying a picture of vivid colors maintaining a good balance of colors and a good balance of light-emitting brightnesses of the EL elements. The widths of the detour wirings supplying current to the power source feed lines are increased for those EL elements into which a current of a large density flows. This constitution decreases the wiring resistances of the detour wirings, decreases the potential drop through the detour wirings, and suppresses the amount of electric power consumed by the detour wirings.

26 Claims, 18 Drawing Sheets

U.S. PATENT DOCUMENTS

| | | |
|---|---|---|
| 6,165,824 A | 12/2000 | Takano et al. |
| 6,191,764 B1 | 2/2001 | Kono et al. |
| 6,207,969 B1 | 3/2001 | Yamazaki |
| 6,246,070 B1 | 6/2001 | Yamazaki et al. |
| 6,255,705 B1 | 7/2001 | Zhang et al. |
| 6,259,138 B1 | 7/2001 | Ohtani et al. |
| 6,259,838 B1 | 7/2001 | Singh et al. |
| 6,313,481 B1 | 11/2001 | Ohtani et al. |
| 6,388,329 B1 | 5/2002 | Kuge et al. |
| 6,404,056 B1 | 6/2002 | Kuge et al. |
| 6,437,764 B1 * | 8/2002 | Suzuki et al. ............... 345/87 |
| 6,469,318 B2 | 10/2002 | Yamada et al. |
| 6,479,333 B1 | 11/2002 | Takano et al. |
| 6,501,227 B1 | 12/2002 | Koyama |
| 6,522,079 B1 | 2/2003 | Yamada |
| 6,548,867 B2 | 4/2003 | Yamada et al. |
| 6,618,029 B1 * | 9/2003 | Ozawa ...................... 345/82 |
| 6,628,067 B2 * | 9/2003 | Kobayashi et al. ......... 313/506 |
| 6,690,110 B1 * | 2/2004 | Yamada et al. ............. 313/506 |
| 6,707,438 B1 * | 3/2004 | Ishizuka et al. ........... 315/169.3 |
| 6,762,754 B2 * | 7/2004 | Murade ..................... 345/204 |
| 2001/0038127 A1 | 11/2001 | Yamazaki et al. |

FOREIGN PATENT DOCUMENTS

| | | |
|---|---|---|
| EP | 0883191 | 12/1998 |
| EP | 1031873 | 8/2000 |
| EP | 1033765 | 9/2000 |
| JP | 08-078519 | 3/1996 |
| JP | 09-148066 | 6/1997 |
| JP | 10-039791 | 2/1998 |
| JP | 10-214060 | 8/1998 |
| JP | 10-232649 | 9/1998 |
| JP | 10-312173 | 11/1998 |
| JP | 3032801 | 4/2000 |

\* cited by examiner

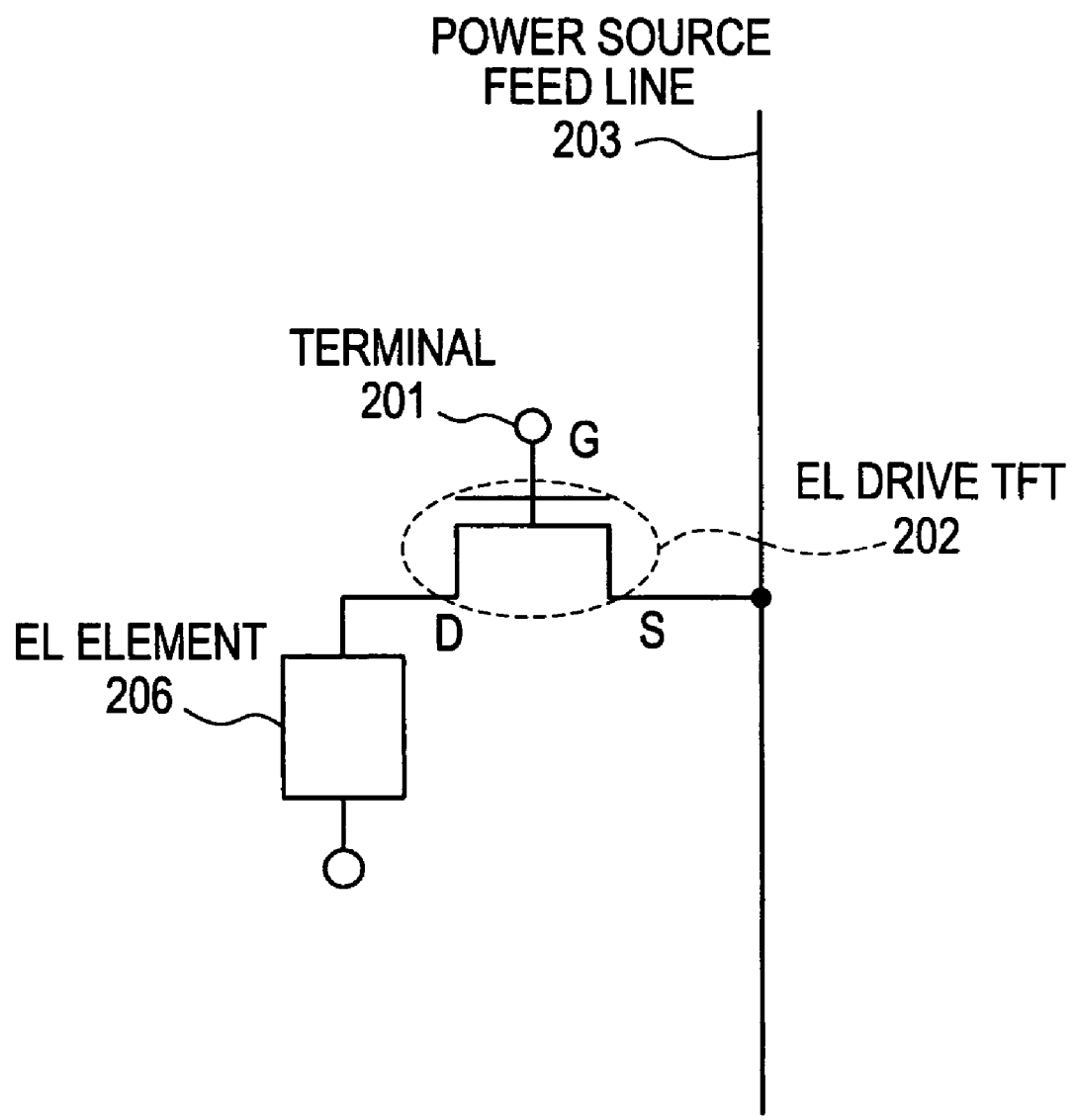

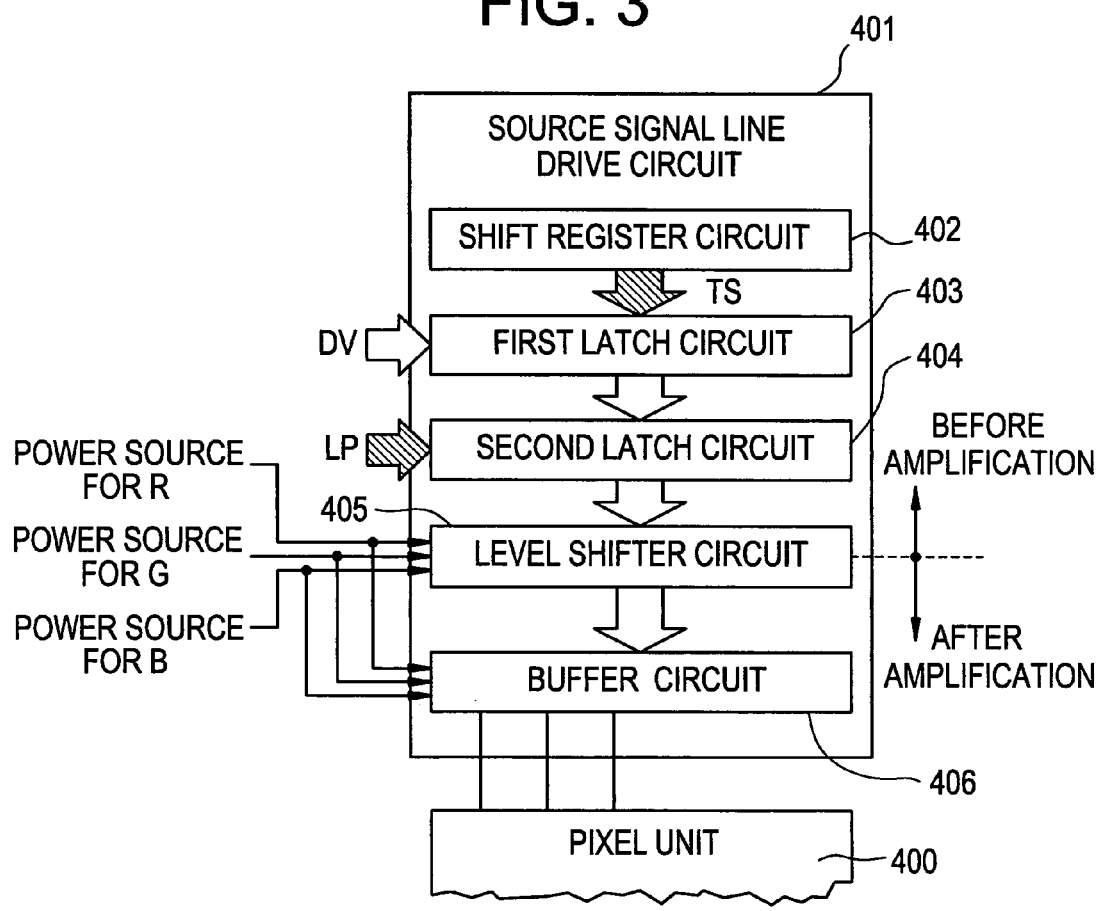

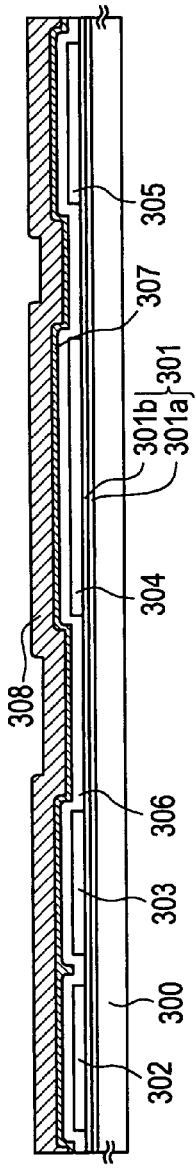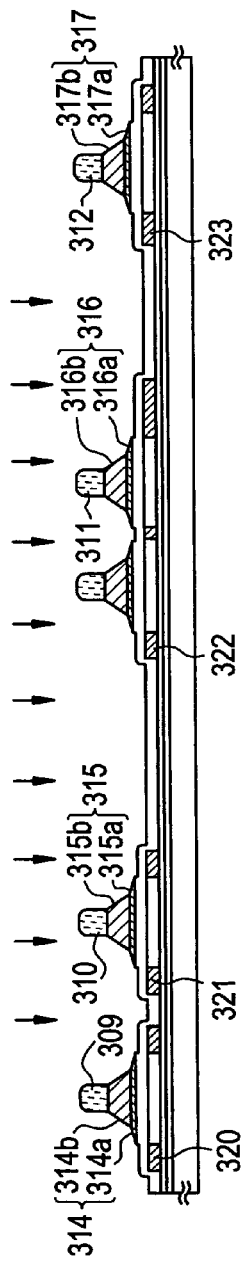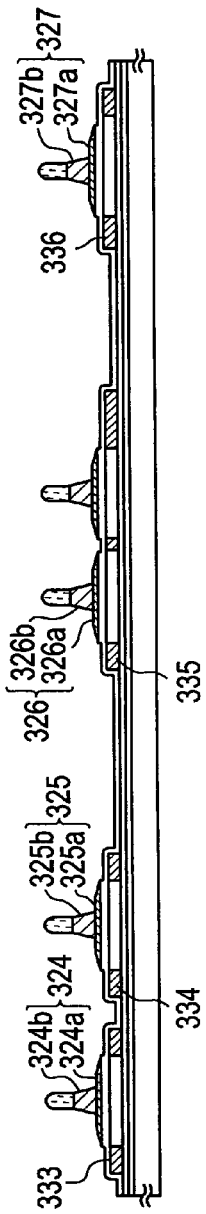

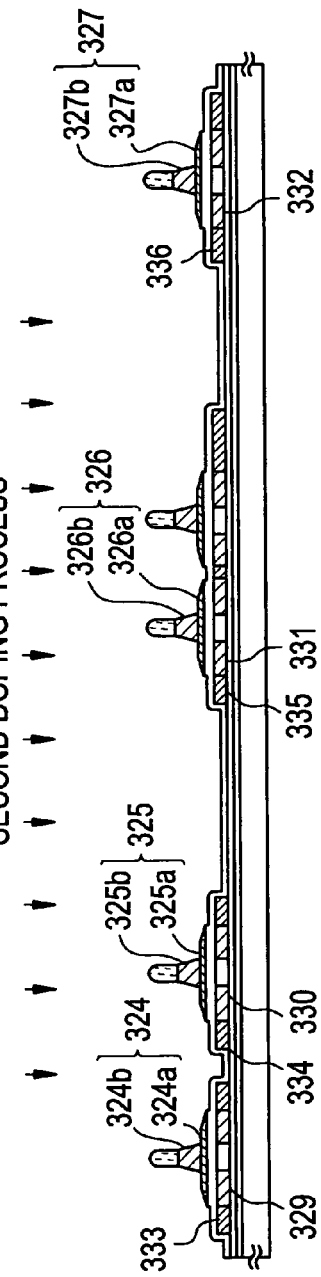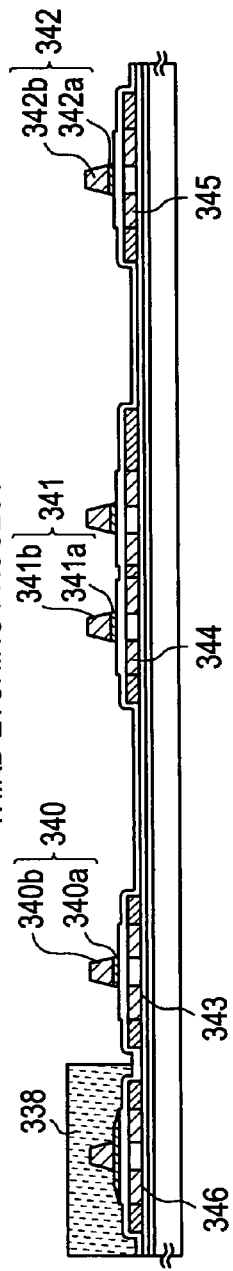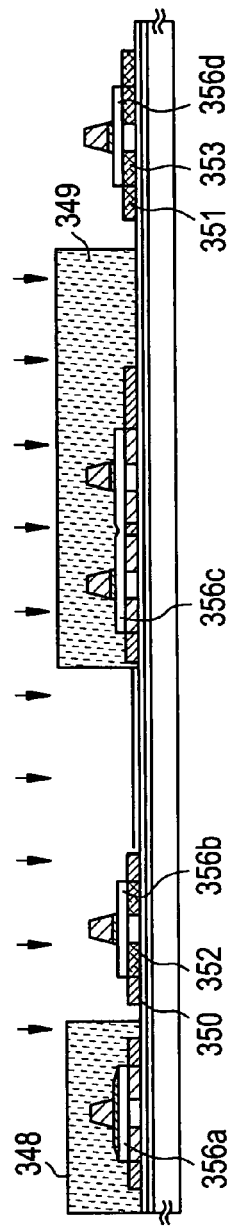

FORMATION OF FIRST INTERLAYER INSULATING FILM / ACTIVATION

FORMATION OF SECOND INTERLAYER INSULATING FILM AND WIRING LINE AND PIXEL ELECTRODE

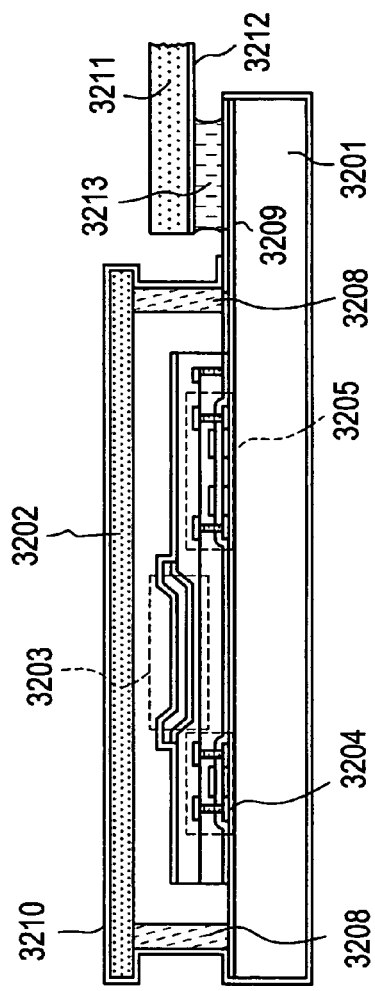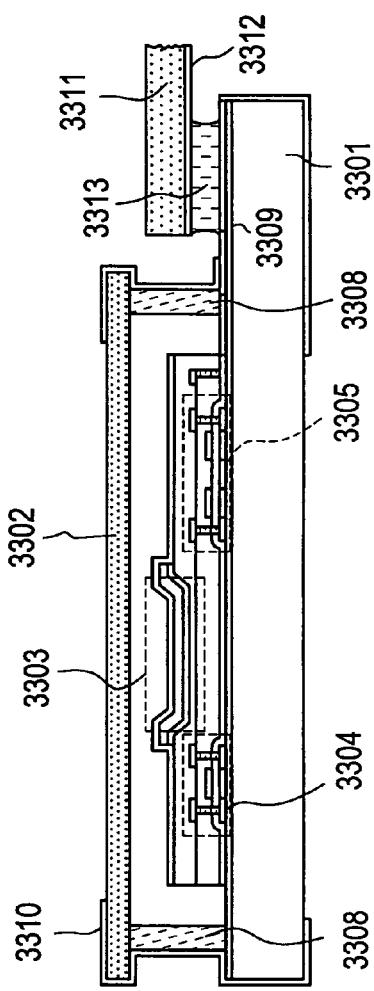

DISPLAY DEVICE AND ELECTRONIC DEVICE

BACKGROUND OF THE INVENTION

1. Field of the Invention

This invention relates to an EL (electroluminescence) display device (a light emitting device or a light emitting diode or OLED (Organic Light Emission Diode) formed by fabricating semiconductor elements (elements using a thin semiconductor film) on a substrate, and to an electronic device which uses the EL display device for a display unit thereof. The EL devices referred to in this specification include triplet-based light emission devices and/or singlet-based light emission devices, for example.

2. Related Art

In recent years, technology for forming TFTs on a substrate has greatly advanced and study has been forwarded to apply the technology to the active matrix-type display devices. In particular, study has been vigorously forwarded concerning the active matrix-type EL display device using EL elements as spontaneously light-emitting elements among the active matrix type display devices. The EL display device is also called organic EL display (OELD) or organic light-emitting diode (OLED).

Unlike liquid crystal display devices, the EL display device is the one that spontaneously emits light. The EL element has a structure in which an EL layer is held between a pair of electrodes, the EL layer being, usually, of a laminated layer structure. The laminated-layer structure can be represented by a "positive hole-transporting layer/light emitting layer/electron-transporting layer" proposed by Tang et al. of Eastman Kodak Co. This structure features a very high light-emitting efficiency, and almost all of the EL display devices that have now been studied and developed are employing this structure.

Luminescence of the organic EL material stems from the emission of light (fluorescence) of when a singlet excited state returns back to the ground state or stems from the emission of light (phosphorescence) of when a triplet excited state returns back to the ground state. The EL element of this invention may utilize either one of the above-mentioned type of light emission or may utilize both of the above-mentioned types of light emission.

In addition to the above, there can be further employed a lamination of positive hole-injection layer/positive hole-transporting layer/light-emitting layer/electron transporting layer or a lamination of positive hole-injection layer/positive hole-transporting layer/light-emitting layer/electron-transporting layer/electron-injection layer on the pixel electrode. The EL layer may be doped with a fluorescent coloring matter.

A predetermined voltage is applied to the thus constituted EL layer from a pair of electrodes, whereby the carriers are recombined together in the light-emitting layer to emit light. In this specification, the EL element is called to have been driven when it emits light.

In this specification, the light-emitting element formed by an anode, an EL layer and a cathode is called EL element.

FIG. 14 illustrates the structure of a representative active matrix-type EL display device (hereinafter referred to as EL display device), wherein FIG. 14(A) shows the arrangement of a pixel unit of the EL display device and a drive circuit therefor. Reference numeral 901 denotes a pixel unit, 902 denotes a source signal line drive circuit, 903 denotes a gate signal line drive circuit, and 905 denotes draw-out terminals.

The pixel unit 901 includes plural pixels 906. Reference numeral 904 denotes power source feed lines formed on the pixel unit 901 to apply a potential to the pixel electrodes of the EL elements possessed by all pixels 906. Power source feed lines 904 are connected to detour wirings 907 which are connected to an external power source via draw-out terminals 905.

Pixels 906 are selected by select signals input to gate signal lines 913 from the gate signal line drive circuit 903. The potential of the power source feed lines 904 is given to the selected pixels 906 due to video signals input to the source signal line 912 from the source signal line drive circuit 902, and the pixels 906 display part of the picture.

FIG. 14(B) is a circuit diagram of pixels corresponding to R (red), G (green) and B (blue) among the pixels 906 shown in FIG. 14(A).

In FIG. 14(B), a pixel 906r for R, a pixel 906g for G and a pixel 906b for B have a common gate signal line 913. Further, the pixel 906r for R has a source signal 912r for R, the pixel 906g for G has a source signal line 912g for G, and the pixel 906b for B has a source signal line 912b for B.

The pixel 906r for R, the pixel 906g for G and the pixel 906b for B have a switching TFT 910 and an EL drive TFT 911, respectively. Further, the pixel 906r for R has an EL element 915r for R, the pixel 906g for G has an EL element 915g for G, and the pixel 906b for B has an EL element 915b for B.

When a select signal is input to the gate signal line 913, the switching TFTs 910 connected at their gate electrodes to the gate signal line 913 are all turned on. In this specification, this state is referred to as that the gate signal line 913 is selected.

Video signals input to the source signal line 912r for R, to the source signal line 912g for G and to the source signal line 912b for B, are further input to the EL element 915r for R, to the EL element 915g for G and to the EL element 915b for B through the switching TFTs 910 which have been turned on, so as to be input to the gate electrodes of the EL drive TFTs 911.

When the video signals are input to the gate electrodes of the EL drive TFTs 911, the potential of the power source feed line 914r for R is applied to the pixel electrode of the EL element 915r for R, the potential of the power source feed line 914g for G is applied to the pixel electrode of the EL element 915g for G, and the potential of the power source feed line 914b for B is applied to the pixel electrode of the EL element 915b for B. As a result, the EL element 915r for R, the EL element 915g for G and the EL element 915b for B emit light, and a display is produced by the pixel 906r for R, by the pixel 906g for G and by the pixel 906b for B.

The EL display devices can be roughly divided into those of the four color display systems, such as those of the system shown in FIG. 14 forming EL elements of three kinds of organic EL materials corresponding to R (red), G (green) and B (blue), those of the system in which white light-emitting EL elements and color filters are combined together, those of the system in which blue or bluish green light-emitting EL elements and a fluorescent material (fluorescent color-conversion layer: CCM) are combined together, and those of the system in which EL elements corresponding to RGB are stacked by using transparent electrodes for the cathodes (opposing electrodes).

In general, even when the same voltage is applied to the EL layer, the light-emitting brightness of the EL layer differs depending upon the organic EL material used for the EL layer. FIG. 15 illustrates voltage—brightness characteristics of the EL layers of each of the colors. As shown in FIG. 15, the light-emitting brightness of the EL layer to the applied voltage, varies depending upon the organic EL materials used for the EL elements of each of the colors. This is because the current density of when the same voltage is applied differs depending upon the organic EL materials.

Even when the current density remains the same, the light-emitting brightness differs depending upon the organic EL materials.

In the EL display device, therefore, the potentials of the power source feed lines for the pixels of each of the colors are usually adjusted to maintain a balance in the light-emitting brightness of the EL elements of three colors.

The magnitude of electric current flowing into the pixel unit through the detour wiring is determined by the number of pixels producing a white display in the pixel unit. The pixels producing the white display stand for those pixel elements having an EL element which is in a light-emitting state. The electric current that flows into the pixel unit via the detour wiring increases with an increase in the number of the pixels producing the white display.

An increase in the current flowing through the detour wiring results in a drop in the potential through the detour wiring. Therefore, the voltage applied to each EL element becomes small and the light-emitting brightness of each pixel decreases when an increased number of pixels are producing the white display.

In the case of the color EL display device, in particular, the voltages applied to the EL elements of each of the colors are adjusted to change the magnitudes of current flowing into the EL elements of each of the colors. An increase in the currents flowing into the pixels results in an increase in the drop of potential through the detour wirings to the corresponding pixels. Therefore, even when the voltages applied to the EL elements of each of the colors are adjusted, the ratio of currents flowing into the EL elements of three colors changes depending upon whether the number of the pixels producing the white display is large or not.

A change in the number of the pixels producing the white display invites a loss of balance in the light-emitting brightness of the pixels corresponding to the three colors.

In the conventional EL display device, the magnitude of current that flows into the EL elements changes depending upon the colors, and different voltages are applied to the EL elements. However, the EL drive TFTs provided as switching elements between the EL elements and the power source feed lines have the same LDD width and the same channel width and, besides, voltages of the digital signals input to the gate electrodes of all EL drive TFTs have the same amplitude. Accordingly, the EL drive TFTs are deteriorated by the magnitudes of voltages applied to the power source feed lines. Besides, when the amplitudes of voltages of digital signals input to the gate electrodes of the EL drive TFT gate electrodes are too great, it becomes difficult to suppress the consumption of electric power.

SUMMARY OF THE INVENTION

In view of the above-mentioned problems, this invention provides an EL display device capable of producing a highly fine color display.

The present inventors have attempted to increase the widths of the detour wirings for those EL elements for which an increased current is to be supplied. Therefore, the wiring resistance of the detour wirings decreases for those pixels to which a large current is to be supplied. As the wiring resistance decreases, a drop of potential through the detour wirings decreases, and a large current can be supplied to the EL elements. In the practical panel, limitation is imposed on space for laying the detour wirings. By changing the ratio of widths of the detour wirings for each of the colors, therefore, it is allowed to maintain a balance in the magnitudes of currents flowing into the EL elements of each of the colors.

Owing to the above constitution, therefore, it is allowed to maintain a balance in the light-emitting brightness of the pixels of R, G and B irrespective of the number of pixels producing the white display.

Further, if not only the detour wirings but also the widths of the power source feed lines are increased for those EL elements of pixels to which large currents are to be supplied, it becomes possible to produce a more highly fine picture.

In this invention, further, the amplitude of the video signals may be increased only for those pixels whose EL elements are to be supplied with a large current. Owing to the above constitution, video signals of too large amplitudes need not be input to all of the pixels, and the consumption of electric power can be suppressed.

Further, the EL drive TFTs for controlling the flow of current to the EL elements permit the flow of a current larger than the current permitted to flow through the switching TFTs that control the EL drive TFTs, so that the EL elements emit light. Here, controlling the TFTs is equal to controlling the voltage applied to the gate electrodes possessed by the TFTs, and has the meaning of turning the TFTs on or off. In this invention constituted as described above, in particular, a large current flows into the EL drive TFTs in the pixels connected to the power source feed lines through which a current of a large absolute value flows. Accordingly, there arises a problem in that the EL drive TFTs of the pixels connected to the power source feed lines through which a current of a large absolute value flows, are deteriorated earlier than the EL drive TFTs of other pixels due to the injection of hot carriers.

To cope with the deterioration of the EL drive TFTs caused by the injection of hot carriers according to the invention, therefore, the lengths of the LDD regions of the EL drive TFTs of the pixels for displaying a color of a low light emitting brightness may be selected to be larger than the lengths of the LDD regions of the EL drive TFTs of the pixels for displaying a color of a high light-emitting brightness, in addition to adopting the above-mentioned constitution.

In this specification, the lengths of the LDD regions are the lengths of the LDD regions in a direction of connecting the source regions to the drain regions.

At the same time, further, the channel width (W) may be increased in the EL drive TFTs of pixels which are connected to the power source feed lines having a large absolute current value.

FIG. 5 shows a top view and a sectional view of a representative TFT. FIG. 5(A) is a top view of TFT, and FIG. 5(B) is a sectional view along A-A' in FIG. 5(A).

Reference numeral 501 denotes a source region, 502 denotes a drain region, and 503 denotes a gate electrode. A channel-forming region 504 is formed under the gate electrode 503 via a gate-insulating film 505. In this specification, the channel width (W) stands for a length of the channel region 504 in a direction perpendicular to the direction of current that flows between the source region 501 and the drain region 502. Further, the channel length (L) stands for a length of the channel region 504 in the direction in which the current flows into the source region 501 and the drain region 50.2.

According to the above-mentioned constitution of the invention, the EL drive TFTs are suppressed from being deteriorated even when the current controlled by the EL drive TFTs has increased due to an increase in the absolute value of current flowing through the power source feed lines. It is further allowed to adjust the light-emitting brightness of the EL element relying on the voltage applied to the EL element and, hence, to display a picture of vivid colors maintaining a good balance in the light-emitting brightnesses of red color, blue color and green color.

BRIEF DESCRIPTION OF THE DRAWINGS

FIG. 2 is a diagram illustrating the constitution of a pixel in the EL display device;

FIG. 3 is a block diagram of a source signal line drive circuit in the EL display device of this invention;

FIGS. 8(A) to 8(C) are views illustrating the steps of fabricating the EL display device;

FIGS. 9(A) to 9(C) are views illustrating the steps of fabricating the EL display device;

FIGS. 19(A) and 19(B) are sectional views of the EL display device using a DLC film of this invention.

DESCRIPTION OF THE PREFERRED EMBODIMENTS

Figure 1A:
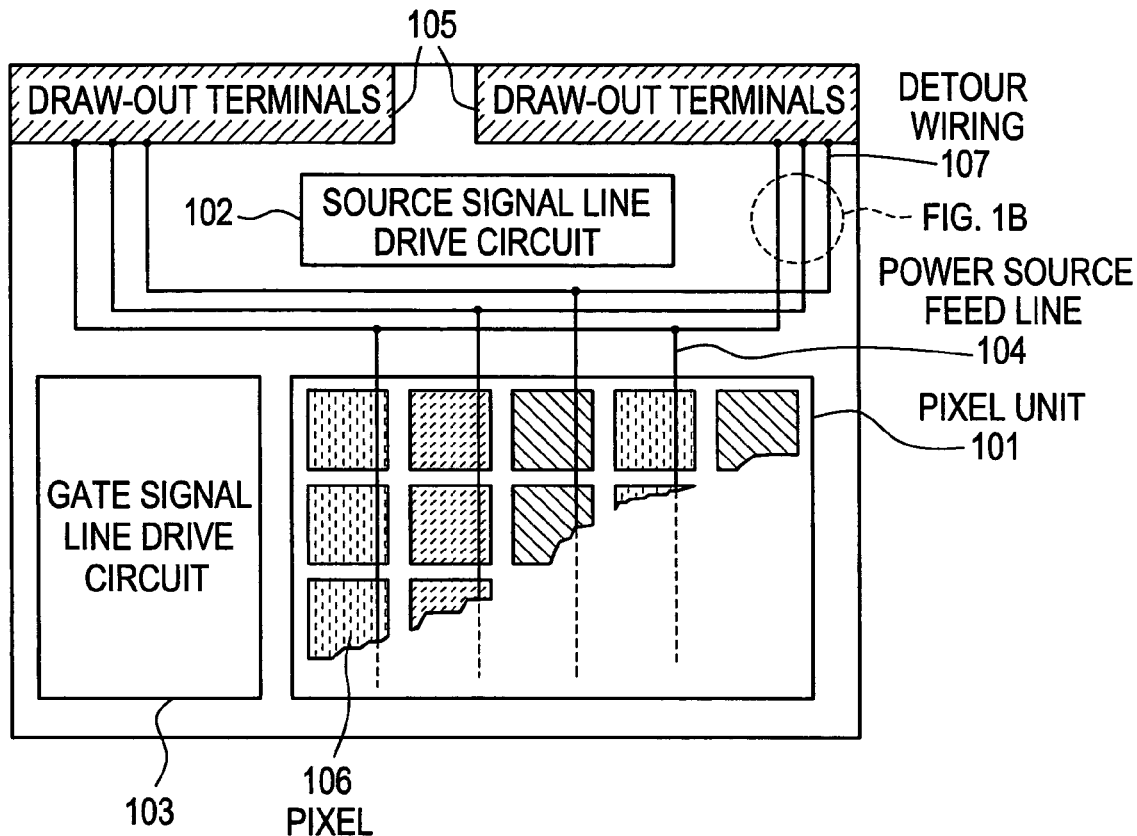
FIGS. 1(A) and 1(B) are diagrams illustrating the constitution of an EL display device according to this invention.

FIG. 1 is a top view of an EL display device of this invention, and FIG. 1(A) illustrates the arrangement of a pixel unit and a drive circuit in the EL display device, wherein reference numeral 101 denotes a pixel unit, 102 denotes a source signal line drive circuit, 103 denotes a gate signal line drive circuit, and 105 denotes draw-out terminals.

The pixel unit 101 has plural pixels 106. Reference numeral 104 denotes power source feed lines provided in the pixel unit 101 to give potential to the pixel electrodes of the EL elements possessed by all of the pixels 106. The power source feed lines 104 are connected to detour wirings 107 which are connected to an external power source via the draw-out terminals 105. The layout of the detour wirings 107 is in no way limited to the form shown in FIG. 1.

Pixels 106 are selected by select signals input to the gate signal lines (not shown) from the gate signal line drive circuit 103. In response to video signals input to the source signal lines (not shown) from the source signal line drive circuit 102, the potential of the power source feed lines 104 is given to the selected pixels 106 which, then, display a part of a picture.

Figure 1B:
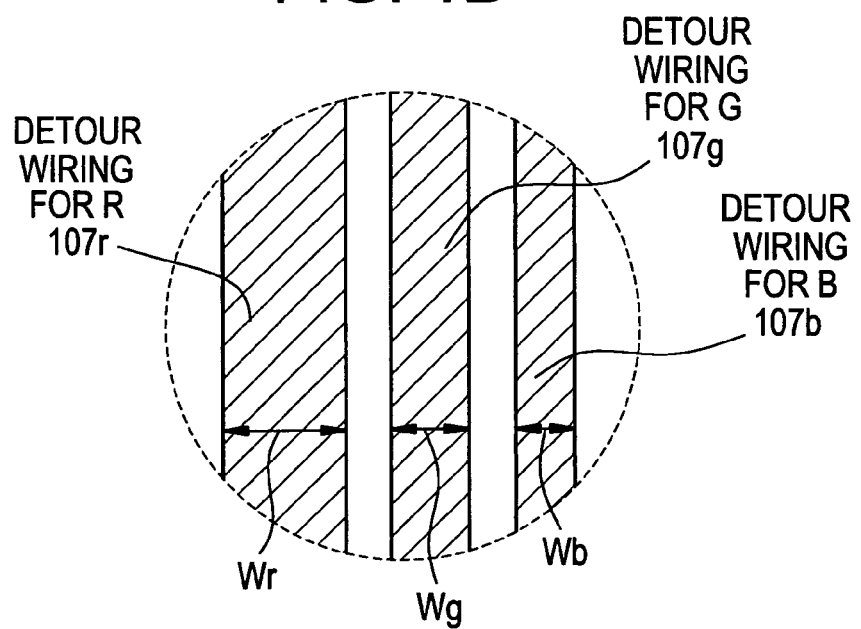

FIG. 1(B) is a diagram illustrating, on an enlarged scale, the detour wirings 107 of FIG. 1(A), and wherein reference numeral 107$r$ denotes a detour wiring for R, 107$g$ denotes a detour wiring for G and 107$b$ denotes a detour wiring for B.

The EL element is connected in series with the detour wirings. Therefore, a ratio of currents flowing through the detour wirings corresponding to the colors RGB corresponds to a ratio of current densities through the EL layers corresponding to the colors RGB. In general, further, the wiring resistance varies in proportion to the sheet resistance and the length of the wiring, but varies in reverse proportion to the width of the wiring. Here, the sheet resistance and the length of the wiring are constant.

Here, the voltage applied to the detour wiring for R is denoted by Vr, the voltage applied to the detour wiring for G is denoted by Vg, the voltage applied to the detour wiring for B is denoted by Vb, the width of the detour wiring for R is denoted by Wr, the width of the detour wiring for G is denoted by Wg, the width of the detour wiring for B is denoted by Wb, the current density of the EL element for R is denoted by Ir, the current density of the EL element for G by Ig and the current density of the EL element for B by Ib. Then, the following formula 1 holds from Ohms' law. Here, a is a constant.

$Vr = a \times Ir/Wr$ $Vg = a \times Ig/Wg$ $Vb = a \times Ib/Wb$ (1)

Here, if Vr=Vg=Vb, then, the following formula 2 is derived, $Ir/Wr = Ig/Wg = Ib/Wb$ (2)

From the formula 2 is derived the following formula 3, $Wr:Wg:Wb = Ir:Ig:Ib$ (3)

From the formula 3, therefore, in order to maintain a balance in the light-emitting brightness of the pixels R, G and B, the width of the detour wirings electrically connected to the EL elements of large current densities is selected to be larger than the width of the detour wirings electrically connected to the EL elements having small current densities. Desirably, the ratio of widths of the detour wirings is selected to satisfy the formula 3.

Not only the detour wirings but also the power source feed lines for feeding voltages or currents to the EL elements of the pixels may be so designed as to possess widths that satisfy the formula 3 for the pixels for which large currents are to be supplied, in order to display a more highly fine picture.

Owing to the above constitution, it is allowed to maintain a balance in the light-emitting brightness of the pixels R, G and B.

EMBODIMENTS

Embodiment 1

In this embodiment, the amplitude of the digital signals is increased for those pixels that require large voltages for the EL elements.

FIG. 2 schematically illustrates the constitution of connection between the EL drive TFT and the EL element in the pixel in the EL display device, and wherein reference numeral 202 denotes an EL drive TFT, 203 denotes a power source feed line, and 206 denotes an EL element. The gate electrode of the EL drive TFT 202 receives a digital signal that is given to a terminal 201. The source region of the EL drive TFT 202 is connected to the power source feed line 203, and the drain region thereof is connected to a pixel electrode possessed by the EL element 206.

If the absolute value of the current given to the power source feed line 203 is increased to increase the light emitting brightness of the EL element, the off current of the EL drive TFT 202 (current that flows in a state where the TFT is turned off) increases. Therefore, it may happen that the EL element emits light even in a state where the EL drive TFT 202 is turned off.

In this invention, the amplitude of the digital signals is increased for those pixels to which a current having a large absolute value is supplied from the power source feed line (concretely speaking, in the case of FIG. 2, digital signals of a large amplitude are input to the terminal 201). Since the amplified digital signals are input to the gate electrodes of the EL drive TFTs 202, $|V_{GS}|$ of the EL drive TFT 202 becomes larger than that of before the digital signal was amplified. Even by increasing the absolute value of the current of the power source feed line 203, therefore, the off current of the EL drive TFT 202 can be suppressed, preventing such an occurrence that the EL element emits light even in a state where the EL drive TFT 202 is turned off.

The invention is not limited to the EL display device which displays a picture by using digital signals only but may also be applied to an EL display device which displays a picture by using analog signals.

Embodiment 2

This embodiment deals with a concrete constitution of the source signal line drive circuit used in the embodiment 1.

FIG. 3 is a block diagram of a source signal line drive circuit according to this embodiment, and wherein reference numeral 400 denotes a pixel unit, and 401 denotes a source signal line drive circuit. The source signal line drive circuit 401 includes a shift register circuit 402, a first latch circuit 403, a second latch circuit 404, a level shifter circuit 405 and a buffer circuit 406.

A digital signal (DV) is input to the first latch circuit 403 from the outside of the source signal line drive circuit 401 and is held therein according to a timing signal (TS) formed by the shift register circuit 402. When the digital signals of all bits are input and held in the first latch circuit 403, the digital signals held in the first latch circuit 403 are input to the second latch circuit 404 at one time and are held therein according to a latch pulse (LP). The operation starts again in which a digital signal (DV) is input to the first latch circuit 403 from outside the source signal line drive circuit 401 and is held therein.

The digital signals input at one time to the second latch circuit 404 and are held therein, are further input to the level shifter circuit 405 and are output therefrom after their amplitudes are amplified. The magnitude of amplification differs in each of the pixels which receive digital signals depending upon the absolute value of the current flowing through the power source feed lines. The amplitude of the digital video signal is increased for those pixels which receive the video signal and for which the current having a large absolute value is supplied from the power source feed lines.

By changing the output voltage of the level shifter circuit, i.e., by changing the power source potential of the level shifter circuit, it is allowed to change the amplitude of the digital signals input to the pixels for each of the colors.

Even by increasing the absolute value of current flowing through the power source feed lines relying upon the above constitution, it is allowed to suppress the off current of the EL drive TFTs preventing such an occurrence that light is emitted by the EL elements even in a state where the EL drive TFTs are turned off.

The amplified digital signals output from the level shifter circuit 405 are buffer-amplified through the buffer circuit 406 and are input to the corresponding source signal lines.

Figure 4:
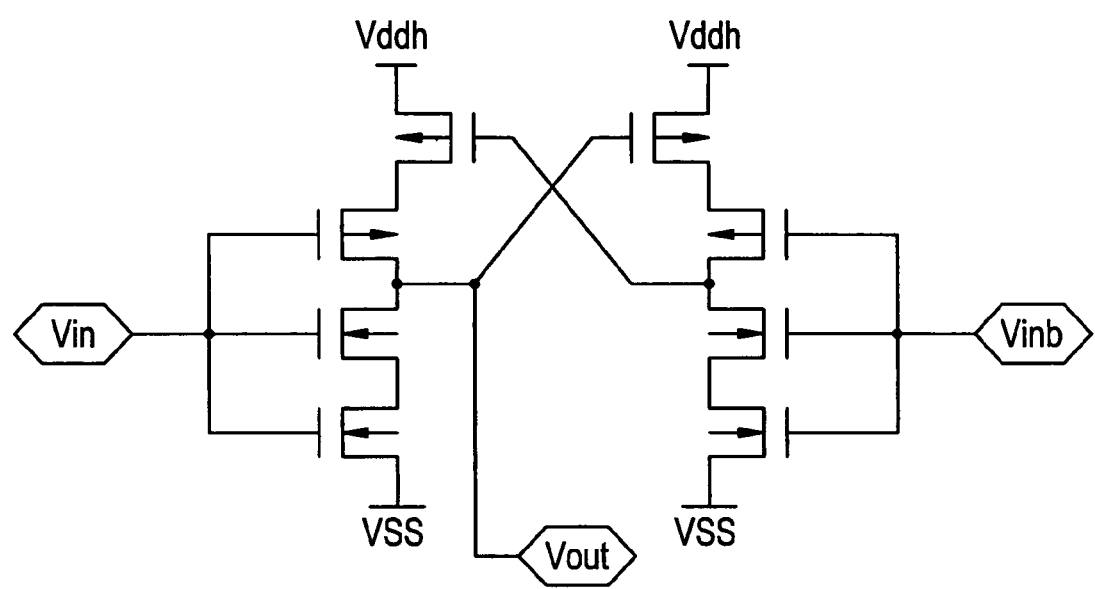
FIG. 4 is a diagram of an equivalent circuit of a level shifter circuit.
Figure 5A:
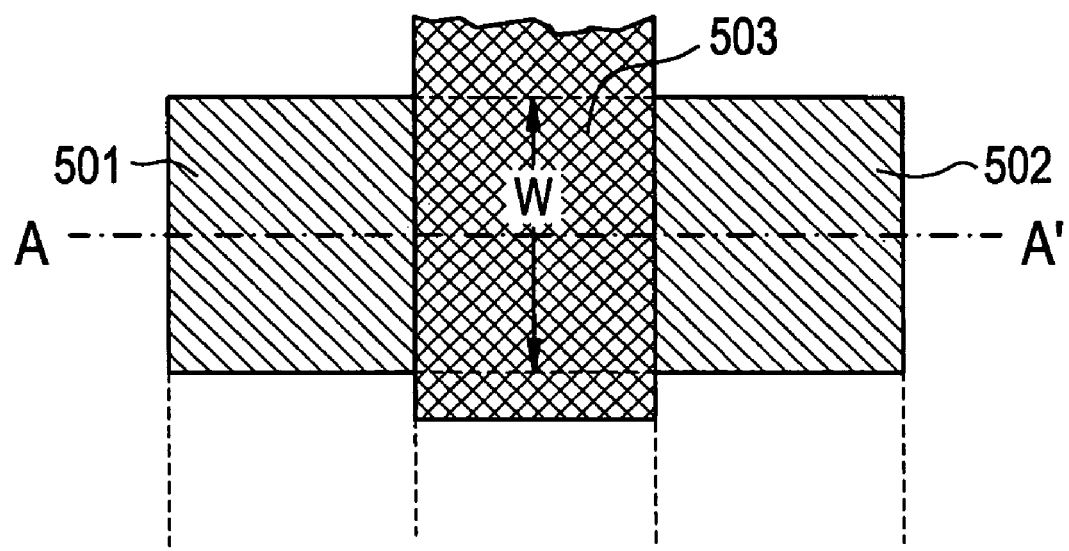
FIGS. 5(A) and 5(B) include a top view and a sectional view of a TFT.
Figure 5B:
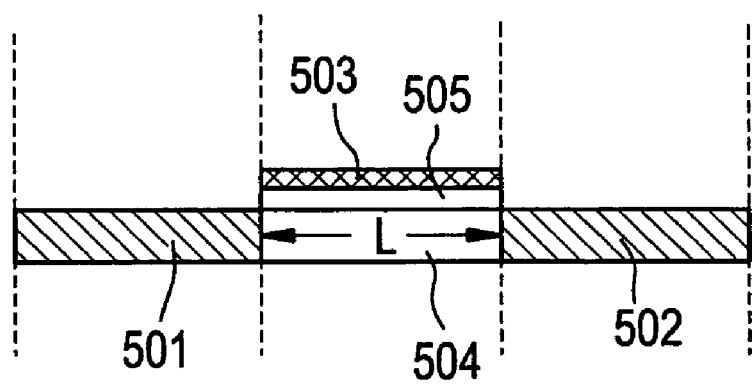

FIG. 4 is an equivalent circuit diagram of a level shifter circuit 405. A digital signal is input through Vin of the level shifter circuit 405. A signal obtained by inverting the polarity of the digital signal is input through Vinb. Symbol Vddh denotes a connection to the power source of the high voltage side, and Vss denotes a connection to the power source of the low voltage side.

The level shifter circuit 403 is so designed that a signal obtained by amplifying the digital signal input to Vin is output from Vout. Concretely speaking, when a digital signal Hi is input to Vin, a signal corresponding to Vss is output from Vout and when a digital signal Lo is input thereto, a signal corresponding to Vddh is output from Vout.

Embodiment 3

This embodiment deals with concrete numerical values of the widths of the detour wirings 107 shown in FIG. 1.

In this embodiment, the current densities through the organic EL materials of R, G and B are selected to be 7.5 mA/cm$^2$, 3 mA/cm$^2$ and 5 mA/cm$^2$ so that the light-emitting brightnesses of the EL elements of R, G and B become 100 cd/m$^2$, 100 cd/M$^2$ and 50 cd/m$^2$.

From the above current densities and in compliance with the formula 3, the ratio of widths of the power source feed lines for the pixels corresponding to R, G and B becomes as given by the formula 4, $$Wr:Wg:Wb \approx 7.5:3:5 \qquad (4)$$

The balance in the light-emitting brightnesses of the pixels R, G, B can be maintained upon designing the widths of the detour wirings in accordance with the formula 4.

In this embodiment, the widths of the detour wirings corresponding to R, G and B need not satisfy the formula 4. The width of the detour wiring corresponding to R may be selected to be the greatest and the width of the detour wiring corresponding to G may be selected to be the smallest.

The above constitution makes it possible to adjust the balance of light-emitting brightnesses of the pixels R, G and B irrespective of the number of the pixels producing the white display.

The balance of the light-emitting brightnesses of the pixels R, G and B can be more effectively adjusted if the width of the power source feed lines for R is selected to be the greatest and the width of the power source feed lines for G to be the smallest in addition to the detour wirings. The balance in the light-emitting brightnesses of the pixels R, G and B can be more favorably adjusted if the widths of the power source feed lines are so designed as to satisfy the formula 4 like the detour wirings.

The current densities of the organic EL materials used in this invention are not limited to the above-mentioned numerical values only.

Though the Example has dealt with the case of amplifying the amplitude of digital signals in the EL display device which produces the display relying on the digital signals, the invention is in no way limited to this constitution only. The invention encompasses even the constitution of amplifying the amplitude of the analog video signals in the EL display device that produces the display relying on the analog video signals.

It is further allowable to carry out this embodiment in free combination with the embodiment 1 or the embodiment 2.

Embodiment 4

In the EL display device of this invention, many TFTs may be provided in each pixel. For example, three to six or more TFTs may be provided. This embodiment deals with the EL display device in which three TFTs are provided in each pixel.

Figure 6A:
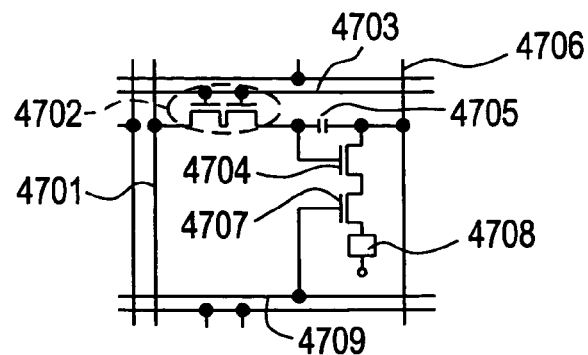
FIGS. 6(A) and 6(B) are circuit diagrams of a pixel in the EL display device.
Figure 6B:
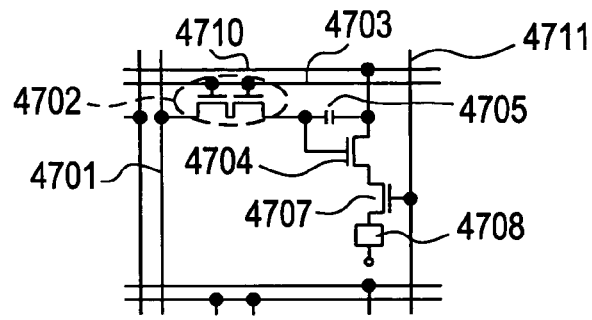

In FIG. 6, reference numeral 4702 denotes a switching TFT, 4701 denotes a source signal line, 4703 denotes a gate signal line connected to the gate electrode of the switching TFT 4702, 4704 denotes an EL drive TFT, 4705 denotes a capacitor (which may not be provided), 4706 denotes a power source feed line, 4707 denotes a power source control TFT, 4708 denotes a gate signal line for controlling the power source, and 4709 denotes an EL element. As for the operation of the power source control TFT 4707, reference should be made to Japanese Patent Application No. 364003/2000.

In this embodiment, further, the electric power control TFT 4707 is provided between the EL drive TFT 4704 and the EL element 4708. It is, however, also allowable to provide the EL driving TFT 4704 between the power source control TFT 4707 and the EL element 4708. It is further desired that the power source control TFT 4707 has the same structure as the EL drive TFT 4704 or is formed in series therewith using the same active layer.

Figure 7A:
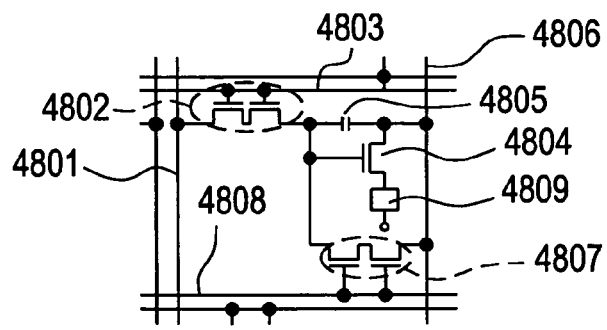
FIGS. 7(A) and 7(B) are circuit diagrams of the pixel in the EL display device.
Figure 7B:
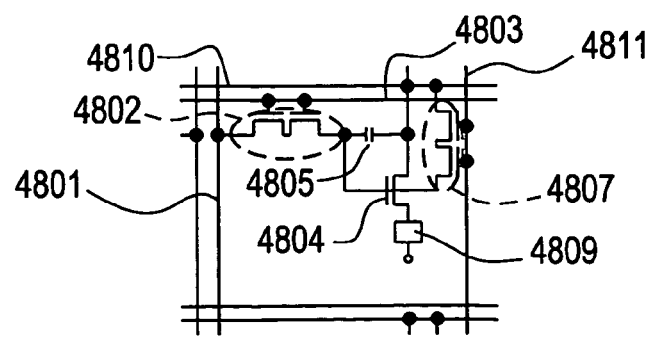

In FIG. 7, reference numeral 4801 denotes a source signal line, 4802 denotes a switching TFT, 4803 denotes a gate signal line connected to the gate electrode of the switching TFT 4802, 4804 denotes an EL driving TFT, 4805 denotes a capacitor (which may not be provided), 4806 denotes a power source feed line, 4807 denotes an erasing TFT, 4808 denotes a gate signal line for erasing, and 4809 denotes an EL element. As for the operation of the erasing TFT 4807, reference should be made to Japanese Patent Application No. 359032/2000.

The drain of the erasing TFT 4807 is connected to the gate of the EL driving TFT 4804 to forcibly change the gate voltage of the EL driving TFT 4804. Here, the erasing TFT 4807 may be an n-channel TFT or a p-channel TFT but should desirably have the same structure as the switching TFT 4802 to decrease the off current.

This embodiment can be carried out in free combination with the embodiments 1 to 3.

Embodiment 5

In this embodiment, in the EL display device of the present invention, a method of simultaneously forming, on the same substrate, a pixel portion and TFTs (n-channel TFT and p-channel TFT) of a driving circuit provided in the periphery of the pixel portion, is described in detail with FIGS. 8A to 11B.

First, in this embodiment, a substrate 300 is used, which is made of glass such as barium borosilicate glass or aluminum borosilicate, represented by such as Corning #7059 glass and #1737 glass. Note that, as the substrate 300, there is no limitation provided that it is a substrate with transmittance, and a quartz substrate may be used. A plastic substrate with heat resistance to a process temperature of this embodiment may also be used.

Then, a base film 301 formed of an insulating film such as a silicon oxide film, a silicon nitride film or a silicon nitride oxide film is formed on the substrate 300. In this embodiment, a two-layer structure is used as the base film 301. However, a single-layer film or a lamination structure consisting of two or more layers of the insulating film may be used. As a first layer of the base film 301, a silicon nitride oxide film 301*a* is formed with a thickness of 10 to 200 nm (preferably 50 to 100 nm) with a plasma CVD method using $SiH_4$, $NH_3$, and $N_2O$ as reaction gas. In this embodiment, the silicon nitride oxide film 301*a* (composition ratio Si=32%, O=27%, N=24% and H=17%) with a film thickness of 50 nm is formed. Then, as a second layer of the base film 301, a silicon nitride oxide film 301*b* is formed and laminated into a thickness of 50 to 200 nm (preferably 100 to 150 nm) with a plasma CVD method using $SiH_4$ and $N_2O$ as reaction gas. In this embodiment, the silicon nitride oxide film 301*b* (composition ratio Si=32%, O=59%, N=7% and H=2%) with a film thickness of 100 nm is formed.

Subsequently, semiconductor layers 302 to 305 are formed on the base film. The semiconductor layers 302 to 305 are formed from a semiconductor film with an amorphous structure which is formed by a known method (such as a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 302 to 305 are formed into the thickness of from 25 to 80 nm (preferably 30 to 60 nm). The material of the crystalline semiconductor film is not particularly limited, but it is preferable to be formed of silicon, a silicon germanium ($Si_xGe_{1-x}$(X=0.0001 to 0.02)) alloy, or the like. In this embodiment, 55 nm thick amorphous silicon film is formed by a plasma CVD method, and then, a nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, a laser annealing treatment is performed to form the crystalline silicon film. Then, this crystalline silicon film is subjected to a patterning process using a photolithography method, to obtain the semiconductor layers 302 to 305.

Further, after the formation of the semiconductor layers 302 to 305, a minute amount of impurity element (boron or phosphorus) may be doped to control a threshold value of the TFT.

Besides, in the case where the crystalline semiconductor film is manufactured by the laser crystallization method, a pulse-oscillation type or continuous-wave type excimer laser, YAG laser, or $YVO_4$ laser may be used. In the case where those kinds of laser are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 300 Hz, and a laser energy density is set as 100 to 400 $mJ/cm^2$ (typically 200 to 300 $mJ/cm^2$). In the case where the YAG laser is used, it is appropriate that the second harmonic is used to with a pulse oscillation frequency of 30 to 300 kHz and a laser energy density of 300 to 600 $mJ/cm^2$ (typically, 350 to 500 $mJ/cm^2$). Then, laser light condensed into a linear shape with a width of 100 to 1000 μm, for example, 400 μm is irradiated to the whole surface of the substrate, and an overlapping ratio (overlap ratio) of the linear laser light at this time may be set as 50 to 90%.

A gate insulating film 306 is then formed for covering the semiconductor layers 302 to 305. The gate insulating film 306 is formed of an insulating film containing silicon by a plasma CVD method or a sputtering method into a film thickness of from 40 to 150 nm. In this embodiment, the gate insulating film 306 is formed of a silicon nitride oxide film into a thickness of 110 nm by a plasma CVD method (composition ratio Si=32%, O=59%, N=7%, and H=2%). Of course, the gate insulating film is not limited to the silicon nitride oxide film, and an other insulating film containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHZ) power density of 0.5 to 0.8 $W/cm^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 8A, on the gate insulating film 306, a first conductive film 307 with a thickness of 20 to 100 nm and a second conductive film 308 with a thickness of 100 to 400 nm are formed and laminated. In this embodiment, the first conductive film 307 of TaN film with a film thickness of 30 nm and the second conductive film 308 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a W target with a purity of 99.9999% or 99.99%, and in addition, by taking sufficient consideration to prevent impurities within the gas phase from mixing therein during the film formation, a resistivity of from 9 to 20 μΩcm can be realized.

Note that, in this embodiment, the first conductive film 307 is made of TaN, and the second conductive film 308 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 309 to 312 made of resist are formed using a photolithography method as shown in FIG. 8B, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-ICP) produced by Matsushita Electric Industrial Co. Ltd. is used here. A 150 W RF (13.56 MHZ) power is also applied to the substrate side (test piece stage) to effectively apply a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, as shown in FIG. 8B, the first etching conditions are changed into the second etching conditions without removing the masks 309 to 312 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (test piece stage) to effectively a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 314 to 317 (first conductive layers 314a to 317a and second conductive layers 314b to 317b) constituted of the first conductive layers and the second conductive layers are formed by the first etching process. Reference numeral 319 denotes a gate insulating film, and regions of the gate insulating film which are not covered by the first shape conductive layers 314 to 317 are made thinner by approximately 20 to 50 nm by etching.

Then, a first doping process is performed to add an impurity element for imparting an n-type conductivity to the semiconductor layer without removing the mask made of resist (FIG. 8B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV. As the impurity element for imparting the n-type conductivity, an element which belongs to group 15 of the periodic table, typically phosphorus (P) or arsenic (As) is used, and phosphorus (P) is used here. In this case, the conductive layers 314 to 317 become masks to the impurity element for imparting the n-type conductivity, and high concentration impurity regions 320 to 323 are formed in a self-aligning manner. The impurity element for imparting the n-type conductivity is added to the high concentration impurity regions 320 to 323 in the concentration range of $1 \times 10^{20}$ to $1 \times 10^{21}$ atoms/$cm^3$.

Thereafter, the second etching process is performed without removing the masks made of resist as shown in FIG. 8C.

Here, a mixed gas of $CF_4$, $Cl_2$ and $O_2$ is used as an etching gas, the gas flow rate is set to 20/20/10 sccm, and plasma is generated by applying a 500 W RF (13.56 MHZ) power to a coil shape electrode under 1 Pa to thereby perform etching. A 20 W RF (13.56 MHZ) power is also applied to the substrate side (test piece stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° in the second etching. Second conductive layers 324b to 327b are formed by the second etching process. On the other hand, the first conductive layers 314a to 317a are hardly etched, and first conductive layers 324a to 327a are formed.

Next, a second doping process is performed. Second conductive layers 324b to 327b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $1.5\times10^{14}$ atoms/cm$^2$, the current density of 0.5 μA and the acceleration voltage of 90 keV. Thus, low concentration impurity regions 329 to 332, which overlap with the first conductive layers, are formed in a self-aligning manner. The concentration of phosphorus (P) in the low concentration impurity regions 329 to 332 is $1\times10^{17}$ to $5\times10^{18}$ atoms/cm$^3$, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive layers toward the inner portions. The concentration, however, keeps almost the same level. Further, the high concentration impurity regions 333 to 336 is formed, where the high concentration impurity elements are doped.

Thereafter, a third etching process is performed by a photolithography method without removing the masks made of resist as shown in FIG. 9B. The tapered portions of the first conductive layers are partially etched to thereby form the regions that overlap with the second conductive layer in the third etching process. However, the mask 338 from resist is formed as shown in FIG. 9B in region where the third etching is not performed.

In the third etching process, a mixed gas of $Cl_2$ and $SF_6$ is used as an etching gas, the gas flow rate is set to 10/50 sccm, and ICP etching method is used as same as first and second etching to perform the third etching process under above condition. In the third etching process, the etching rate for TaN is 111.2 nm/min, and the etching rate for a gate insulating film is 12.8 nm/min.

In this embodiment, plasma is generated by applying a 500 W RF (13.56 MHZ) to a coil shape electrode under 1.3 Pa to thereby perform etching. A 10 W RF (13.56 MHZ) power is also applied to the substrate side (test piece stage) to effectively apply a negative self-bias voltage. Accordingly the first conductive layers 340a to 342a is formed.

In accordance with the third etching process, impurity regions (LDD regions) 343 to 345 are formed, which do not overlap with the first conductive layers 340a to 342a. Note that, impurity regions (GOLD regions) 346 remain overlapped with the first conductive layer 324a.

The electrode formed of the first conductive layer 324a and the second conductive layer 324b becomes a gate electrode of an n-channel TFT of a driving circuit to be formed in the later process. The electrode formed of the first conductive layer 340a and the second conductive layer 340b becomes a gate electrode of a p-channel TFT of the driving circuit to be formed in the later process.

Similarly, the electrode formed of the first conductive layer 341a and the second conductive layer 341b becomes a gate electrode of an n-channel TFT of a pixel portion to be formed in the later process, and the electrode formed of the first conductive layer 342a and the second conductive layer 342b becomes a gate electrode of a p-channel TFT of the pixel portion to be formed in the later process.

In accordance with the above processes, in this embodiment, the impurity regions (LDD region) 343 to 345 that do not overlap with the first conductive layers 340a to 342a and the impurity region (GOLD region) 346 that overlap with the first conductive layer 324a can be formed simultaneously, and formed corresponding to TFT characteristics.

Next, the third etching process is performed to the gate insulating film 319. Here, $CHF_3$ is used as an etching gas, and a reactive etching method (RIE method) is used. In this embodiment, the third etching process is performed with the chamber pressure of 6.7 Pa, the RF power of 800 W, the $CHF_3$ gas flow rate of 35 sccm.

Therefore, the apart of the high concentration impurity regions 333 to 336 is exposed and the insulating films 356a to 356d.

Next, the masks of resist are removed, masks 348 and 349 are newly formed of resist, and a third doping process is performed. In accordance with the third doping process, impurity regions 350 to 355 are formed, in which the impurity element imparting a conductivity (p-type) opposite to the above conductivity (n-type) is added to the semiconductor layer that becomes an active layer of the p-channel TFT (FIG. 9C). The first conductive layers 340a and 342a are used as masks to the impurity element, and the impurity element that imparts the p-type conductivity is added to thereby form impurity regions in a self-aligning manner.

In this embodiment, the impurity regions 350 to 355 are formed by an ion doping method using diborane ($B_2H_6$). Note that, in the third doping process, the semiconductor layer to become the n-channel TFT is covered with the masks 348 and 349 formed of resist. Although phosphorus is added to the impurity regions 350 and 353 to become the p-channel TFT of the source region and the drain region at different concentrations in accordance with the first and second doping processes, the doping process is performed such that the concentration of the impurity element imparting p-type conductivity is in the range of $2\times10^{20}$ to $2\times10^{21}$ atoms/cm$^3$ in any of the impurity regions.

In accordance with the above-described processes, the impurity regions are formed in the respective semiconductor layers.

Subsequently, the masks 348 and 349 of resist are removed, and a first interlayer insulating film 357 is formed. This first interlayer insulating film 357 is formed of an insulating film containing silicon by a plasma CVD method or a sputtering method into a thickness of 100 to 200 nm. In this embodiment, a silicon nitride oxide film with a film thickness of 150 nm is formed by a plasma CVD method. Of course, the first interlayer insulating film 357 is not particularly limited to the silicon nitride oxide film, but an other insulating film containing silicon may be formed into a single layer or a lamination structure.

Figure 10A:
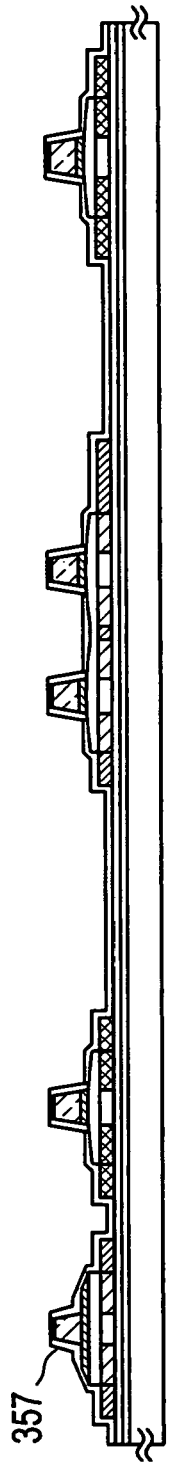
FIGS. 10(A) to 10(B) are diagrams illustrating the steps of fabricating the EL display device.

Then, as shown in FIG. 10A, a step of activating the impurity elements added in the respective semiconductor layers is performed. This activation step is carried out by thermal annealing using a furnace annealing oven. The thermal annealing may be performed in a nitrogen atmosphere containing an oxygen content of 1 ppm or less, preferably 0.1 ppm or less, at 400 to 700° C., typically 500 to 550° C. In this embodiment, a heat treatment at 550° C. for 4 hours is carried out. Note that, except the thermal annealing method, a laser annealing method, or a rapid thermal annealing method (RTA method) can be applied thereto.

Note that, in this embodiment, at the same time as the above activation process, nickel used as the catalyst in crystallization is gettered to the impurity regions (334 to 336, 350 and 351) containing phosphorous at a high concentration. As a result, nickel concentration of the semiconductor layer which becomes a channel forming region is mainly lowered. The TFT with a channel forming region thus formed has an off current value decreased, and has high electric field mobility because of good crystallinity, thereby attaining satisfactory characteristics.

The activation may be carried out before the first interlayer insulating film is formed. However, if the material used for the wiring is weak against heat, it is preferred to conduct activation after the interlayer insulating film (an insulating film containing silicon as main ingredient, e.g., a silicon nitride film) as in this embodiment in order to protect the wiring and others as well.

Besides, a doping method is performed after an activation process thereby to form a first interlayer insulating film.

In addition, heat treatment at 300 to 550 ° C. for 1 to 12 hours is performed in an atmosphere containing hydrogen of 3 to 100%, to perform a step of hydrogenating the semiconductor layers. In this embodiment, the heat treatment is performed at 410° C. for 1 hour in an atmosphere containing hydrogen of about 3%. This step is a step of terminating dangling bonds in the semiconductor layer with hydrogen in the interlayer insulating film. As another means for hydrogenation, plasma hydrogenation (using hydrogen excited by plasma) may be carried out.

Besides, in the case of using a laser annealing method as the activation process, it is preferred to irradiate laser light such as an excimer laser or a YAG laser after the hydrogenating process.

Figure 10B:
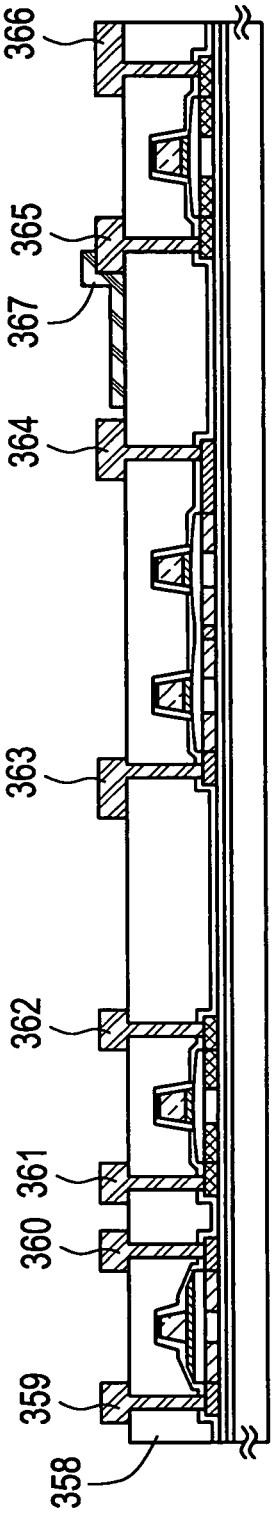

Next, as shown in FIG. 10B, a second interlayer insulating film 358 is formed on the first interlayer insulating film 357 from an organic insulating material. In this embodiment, an acrylic resin film with a thickness of 1.6 mm is formed. Patterning is then performed to form contact holes respectively reaching the impurity regions 333, 335, 350, and 351.

A film of an insulating material containing silicon or of a film of an organic resin can be used as the second interlayer insulating film 358. Examples of the usable insulating material containing silicon include silicon oxide, silicon nitride, and silicon oxynitride. Examples of the usable organic resin include polyimide, polyamide, acrylic, and BCB (benzocyclobutene).

In this embodiment, a silicon oxynitride film is formed by plasma CVD. The thickness of the silicon oxynitride film is desirably 1 to 5 mm (more desirably 2 to 4 mm). A silicon oxynitride film, with its small water content, is effective in limiting the degradation of the EL element.

The contact holes can be formed by dry etching or wet etching. Considering the problem of electrostatic discharge damage in etching, wet etching is desirable.

When forming the contact holes here, the first interlayer insulating film and the second interlayer insulating film are etched at the same time. Then taking the shape of the contact holes into calculation, a preferable material for the second interlayer insulating film has an etching rate faster than the etching rate of the material of the first interlayer insulating film.

Thus obtained are wiring lines 359 to 366 electrically connected to the impurity regions 333, 335, 350 and 351, respectively. A laminate of a Ti film with a thickness of 50 nm and an alloy film (an alloy film of Al and Ti) with a thickness of 500 nm is then formed by patterning. Other conductive films may be formed instead.

Next, a transparent conductive film is formed on the laminate to a thickness of 80 to 120 nm and patterned to form a transparent electrode 367. (FIG. 10B) The transparent conductive film used as the transparent electrode in this embodiment is an indium oxide—tin (ITO) film or an indium oxide film with 2 to 20% of zinc oxide (ZnO) mixed thereto.

The transparent electrode 367 is formed so as to directly overlap with the drain wiring line 365, thereby establishing an electric connection with a drain region of an EL driving TFT.

As shown in FIG. 11A, an insulating film containing silicon (a silicon oxide film, in this embodiment) is next formed to a thickness of 500 nm. An opening is formed in the insulating film at a position corresponding to the transparent electrode 367 to form a third interlayer insulating film 368 functioning as a bank. When the opening is formed, side walls thereof can readily be tapered by wet etching. If the side walls of the opening are not gentle enough, the level difference causes a serious degradation of the EL layer. Therefore the opening has to be formed with a great care.

Although a silicon oxide film is used as the third interlayer insulating film in this embodiment, an organic resin film such as a polyimide film, a polyamide film, an acrylic film, or a BCB (benzocyclobutene) film may be used in some cases.

Figure 11:
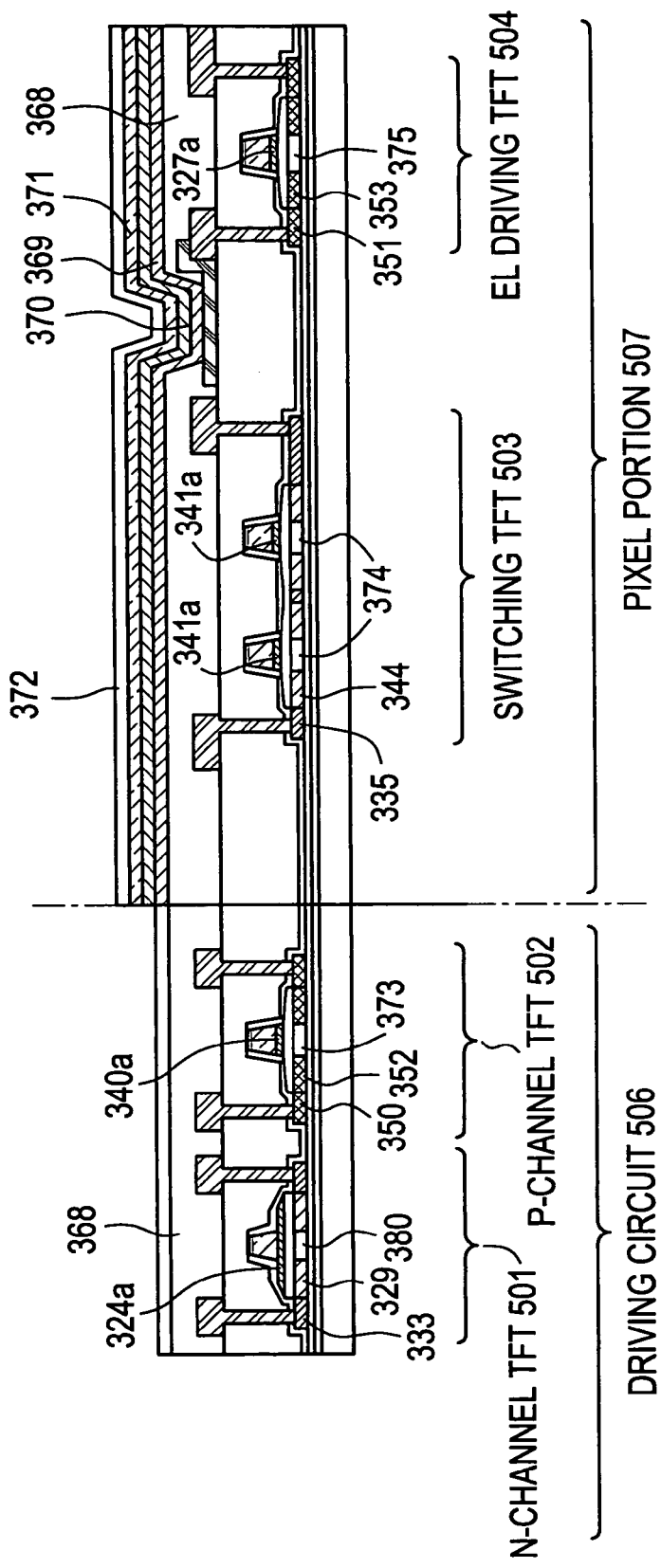
FIG. 11 is a diagram illustrating the steps of fabricating the EL display device.

Next, an EL layer 369 is formed by evaporation as shown in FIG. 11, and further a cathode (an MgAg electrode) 370 and a protective electrode 371 are then formed by evaporation. Prior to forming the EL layer 369 and the cathode 370, the transparent electrode 367 is preferably subjected to heat treatment to remove moisture completely. The cathode of the EL element, the MgAg electrode in this embodiment, may be formed of other known materials.

The EL layer 369 can be formed of known materials. The EL layer in this embodiment has a two-layer structure consisting of a hole transporting layer and a light emitting layer. However, a hole injection layer, an electron injection layer or an electron transporting layer may be added to the two-layer structure. There have been proposed various combinations of the layers for the EL layer, and any one of them can be used in this embodiment.

Polyphenylene vinylene in this embodiment is formed by evaporation to transform into the hole transporting layer. The light emitting layer in this embodiment is formed by evaporation of polyvinyl carbazole molecular-dispersed with 30 to 40% of PBD of 1,3,4-oxadiazole derivative, and doping the film with about 1% of coumarin 6 as the center of green light emission.

Although a protective electrode 371 alone can protect the EL layer 369 from moisture and oxygen, it is more desirable to form a passivation film 372. In this embodiment, a silicon nitride film with a thickness of 300 nm is formed as the passivation film 372. The passivation film also can be formed successively without exposing the device to the air after the protective electrode 371 is formed.

The protective electrode 371 is provided to prevent degradation of the cathode 370, and typically is a metal film containing aluminum as its main ingredient. Needless to say, other materials can be used for the electrode. The EL layer 369 and the cathode 370 are very weak against moisture. Therefore it is desirable to protect the EL layer from the outside air by successively forming the films up through formation of the protective electrode 371 without exposing the device to the air.

An appropriate thickness of the EL layer 369 is 10 to 400 nm (typically 60 to 150 nm), and an appropriate thickness of the cathode 370 is 80 to 200 nm (typically 100 to 150 nm).

Thus completed is an EL display device structured as shown in FIG. 11. In the process of manufacturing an EL display device according to this embodiment, due to the circuit structure and process, source signal lines are formed from Ta and W that are materials of the gate electrode whereas gate signal lines are formed from Al that is a wiring material for forming the source and drain electrode. However, the source signal lines and the gate signal lines may be formed from other materials.

A driving circuit 506 having an n-channel TFT 501 and a p-channel TFT 502 can be formed on the same substrate on which a pixel portion 507 having a switching TFT 503, an EL driving TFT 504.

The n-channel TFT 501 of the driving circuit 506 has a channel formation region 380; a low concentration impurity region 329 overlapping with a first conductive layer 324a that constitutes a part of a gate electrode (GOLD region); and a high concentration impurity region 333 functioning as a source region or a drain region. The p-channel TFT 502 has a channel formation region 373; an impurity region 352 not overlapping with a first conductive layer 340a that constitutes a part of a gate electrode; and an impurity region 350 functioning as a source region or a drain region.

The switching TFT 503 of the pixel portion 507 has a channel formation region 374; a low concentration impurity region 344 not overlapping with a first conductive layer 341a formed outside the gate electrode (LDD region); and a high concentration impurity region 335 functioning as a source region or a drain region.

The EL driving TFT 504 of the pixel portion 507 has a channel formation region 375; an impurity region 353 not overlapping a first conductive layer 327a which is structuring a part of the gate electrode; a high concentration impurity region 351 functioning as a source region or a drain region.

Embodiment 6

This embodiment deals with the fabrication of the EL display device according to the invention with reference to FIGS. 16 and 17.

Figure 16A:
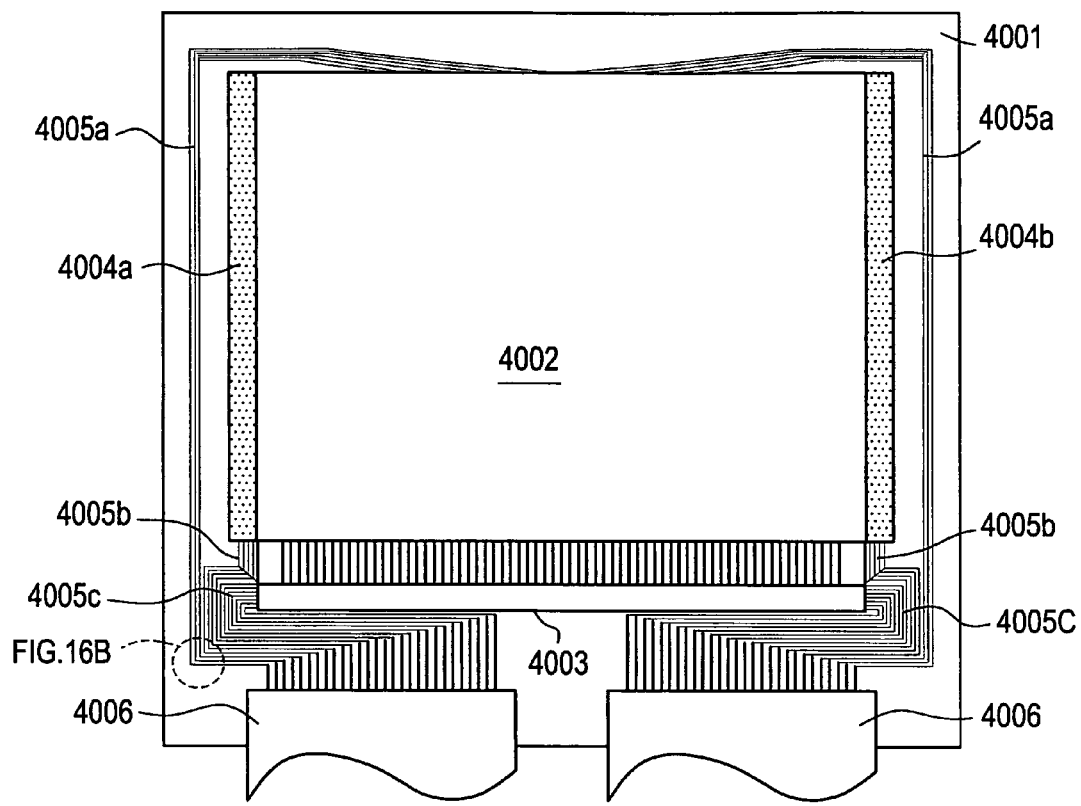
FIGS. 16(A) and 16(B) are top views of a TFT substrate in the EL display device of this invention.

FIG. 16(A) is a top view of a TFT substrate in the EL display device according to this invention. In this specification the TFT substrate stands for a substrate on which the pixel unit is provided.

On the substrate 4001 are provided the pixel unit 4002, the source signal line drive circuit 4003, the first gate signal line drive circuit 4004a and the second gate signal line drive circuit 4004b. In this invention, the numbers of the source signal line drive circuits and of the gate signal line drive circuits are not limited to the numbers shown in FIG. 16(A). The numbers of the source signal line drive circuits and of the gate signal line drive circuits can be suitably set by a designer. In this Example, further, though the source signal line drive circuits and the gate signal line drive circuits are provided on the TFT substrate, the invention is in no way limited to this constitution only. The source signal line drive circuits and the gate signal line drive circuits provided on a substrate separate from the TFT substrate may be electrically connected to the pixel unit through external connection terminals such as FPC or TAB.

Reference numeral 4005a denotes a detour wiring connected to the power source feed lines (not shown) provided on the pixel unit 4002, reference numeral 4005b denotes a detour wiring for gates connected to the first and second gate signal line drive circuits 4004a and 4004b, and reference numeral 4005c denotes a detour wiring for sources connected to the source signal line drive circuit 4003.

The detour wiring 4005b for gates and the detour wiring 4005c for sources are connected to an IC or the like on the outside of the substrate 4001 through the FPCs 4006. Further, the detour wiring 4005a is connected to the power source on the outside of the substrate 4001 through the FPC 4006.

Figure 16B:
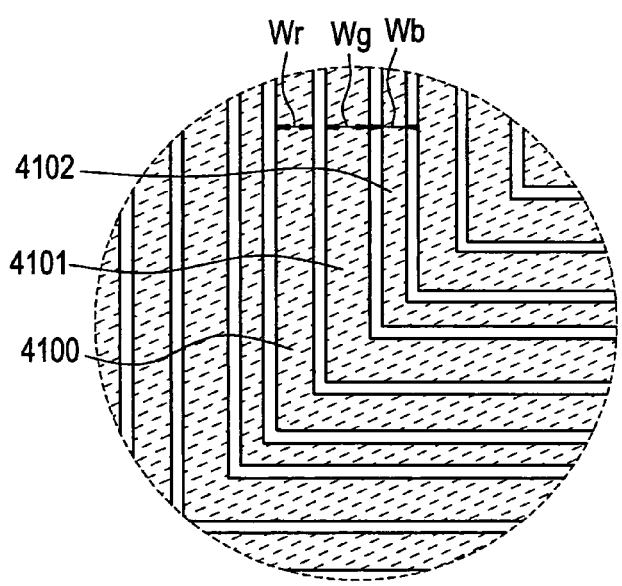

FIG. 16(B) is a view illustrating the detour wiring 4005a on an enlarged scale, wherein 4100 denotes a detour wiring for R, 4101 denotes a detour wiring for G, and 4102 denotes a detour wiring for B.

If it is presumed that the ratio of the current density in the EL layer of the EL element for R, current density in the EL layer of the EL element for G and current density in the EL layer of the EL element for B, is 1.15:1.29:1, then, it is important in the invention that the width Wr of the detour wiring 4100 for R, the width Wg of the detour wiring 1401 for G and the width Wb of the detour wiring 4102 for B are Wg>Wr>Wb. More preferably from the formula 3 in the embodiment, Wr:Wg:Wb≅1.15:1.29:1.

The above constitution of this invention makes it possible to obtain a balance in the light-emitting brightnesses of the pixels R, G and B.

Figure 17A:
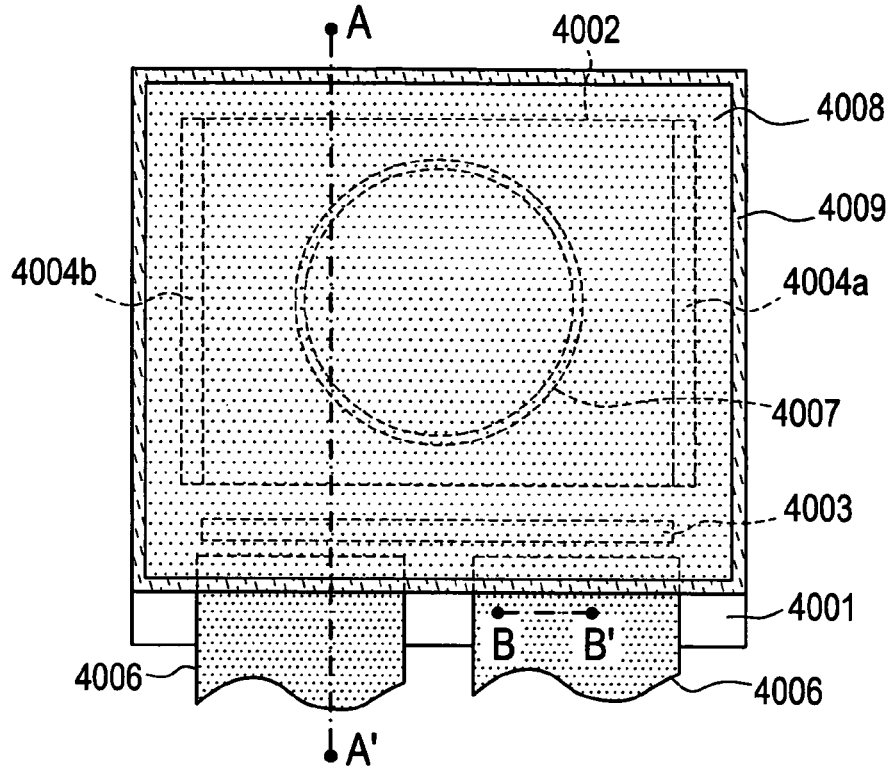
FIGS. 17(A) to 17(C) include a perspective view and a sectional view of the EL display device of this invention.
Figure 17B:
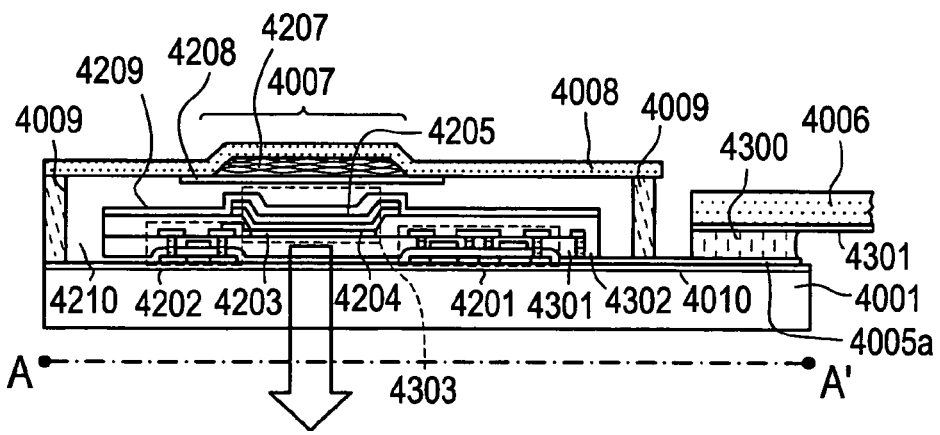
Figure 17C:
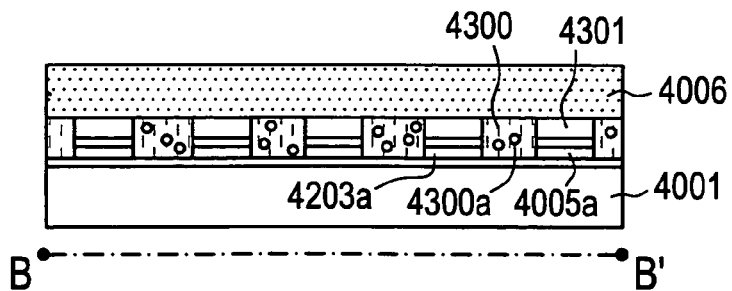

FIG. 17(A) is a top view of the EL display device formed by sealing the TFT substrate shown in FIG. 16(A) with a sealing member, FIG. 17(B) is a sectional view along A-A' in FIG. 17(A), and FIG. 17(C) is a sectional view along B-B' in FIG. 17(A). Those shown already in FIG. 16 are denoted by the same reference numerals.

The sealing member 4009 is so provided as to surround the pixel unit 4002, source signal line drive circuit 4003, and first and second gate signal line drive circuits 4004a, 4004b formed on the substrate 4001. Further, a sealing member 4008 is provided on the pixel unit 4002, on the source signal line drive circuit 4003 and on the first and second gate signal line drive circuits 4004a, 4004b. Accordingly, the pixel unit 4002, source signal line drive circuit 4003, and first and second gate signal line drive circuits 4004a, 4004b are sealed with a filler material 4210 being surrounded by the substrate 4001, sealing member 4009 and sealing member 4008.

Plural TFTs are possessed by the pixel unit 4002, by the source signal line drive circuit 4003 and by the first and second gate signal line drive circuits 4004a, 4004b formed on the substrate 4001. FIG. 17(B) representatively illustrates drive TFTs (here, an n-channel TFT and a p-channel TFT) 4201 formed on the underlying film 4010 and included in the source signal line drive circuit 4003, and EL drive TFT (TFT for controlling the current flowing into the EL element) 4202 included in the pixel unit 4002.

In this embodiment, the drive TFT 4201 is a p-channel TFT or an n-channel TFT fabricated by a known method, and the EL drive TFT 4202 is a p-channel TFT fabricated by a known method. Further, the pixel unit 4002 is provided with a holding capacity (not shown) connected to the gate of the EL drive TFT 4202.

An interlayer insulating film (flattened film) 4301 is formed on the drive TFT 4201 and on the EL drive TFT 4202, and on which is formed a pixel electrode (anode) 4203 electrically connected to the drain of the EL drive TFT 4202. As the pixel electrode 4203, there is used a transparent electrically conducting film having a large work function. As the transparent electrically conducting film, there can be used a compound of indium oxide and tin oxide, a compound of indium oxide and zinc oxide, zinc oxide, tin oxide or indium oxide. It is also allowable to add gallium to the transparent electrically conducting film.

An insulating film 4302 is formed on the pixel electrode 4203. An opening is formed in the insulating film 4302 on the pixel electrode 4203. An EL (electroluminescence) layer 4204 is formed in the opening on the pixel electrode 4203. The EL layer 4204 may be made of a known organic EL material or an inorganic EL material. Further, the organic EL material may be either a low-molecular (monomeric) material or a high molecular (polymeric) material.

The EL layer 4204 may be formed by a known deposition technology or a coating technology. Further, the EL layer may have a laminated-layer structure of a positive hole-injection layer, a positive hole-transporting layer, a light-emitting layer, and an electron-transporting layer or an electron injection layer, or may have a single-layer structure.

On the EL layer 4204 is formed a cathode 4205 comprising an electrically conducting film (typically, an electrically conducting film comprising chiefly aluminum, copper or silver, or a laminated-layer film thereof with other electrically conducting films) having light-shielding property. It is desired that water and oxygen are removed as much as possible from the interface between the cathode 4205 and the EL layer 4204. It is therefore necessary to make such a contrivance that the EL layer 4204 is formed in a nitrogen or a rare gas atmosphere, and the cathode 4205 is formed while being kept away from oxygen and water. In this embodiment, the film is formed as described above by using a film-forming device of the multi-chamber type (cluster tool type). A predetermined voltage is given to the cathode 4205.

There is thus formed an EL element 4303 comprising the pixel electrode (anode) 4203, EL layer 4204 and cathode 4205. A protection film 4303 is formed on the insulating film 4302 so as to cover the EL element 4303. The protection film 4303 is effective in preventing oxygen and water from entering into the EL element 4303.

Reference numeral 4005a is a detour wiring connected to the power source feed wiring, and is electrically connected to the source region of the EL drive TFTs 4202. The detour wiring 4005a is electrically connected to the FPC wiring 4301 possessed by the FPC 4006 passing through between the sealing member 4009 and the substrate 4001 and via an anisotropic electrically conducting film 4300.

As the sealing member 4008, there can be used a glass member, a metal member (representatively, a stainless steel member), a ceramic member or a plastic member (inclusive of a plastic film). As the plastic member, there can be used an FRP (Fiberglass-Reinforced Plastic) plate, a PVF (polyvinyl fluoride) film, a Mylar film, a polyester film, or an acrylic resin film. It is also allowable to use a sheet of a structure in which an aluminum foil is sandwiched by the PVF films or the Mylar films.

When light emitted from the EL element is directed toward the cover member, however, the cover member must be transparent. In this case, use is made of a transparent material such as glass plate, a plastic plate, a polyester film or an acrylic film.

As the filler material 4210, there can be used an ultraviolet-ray curable resin or a thermosetting resin in addition to the inert gas such as nitrogen or argon. Namely, there can be used a PVC (polyvinyl chloride), an acrylic resin, a polyimide, an epoxy resin, a silicone resin, a PVB (polyvinyl butyral) or an EVA (ethylenevinyl acetate). In this embodiment, nitrogen is used as the filler material.

In order to have the filler material 4210 exposed to a hygroscopic material (preferably, barium oxide) or a material capable of adsorbing oxygen, further, a recessed portion 4007 is formed in the sealing member 4008 on the side of the substrate 4001, and the hygroscopic material or the material 4207 capable of adsorbing oxygen is disposed therein. The hygroscopic material or the material 4207 capable of adsorbing oxygen is held in the recessed portion 4007 by a recessed portion-covering member 4208, so that the hygroscopic material or the material 4207 capable of adsorbing oxygen will not scatter. The recessed portion-covering member 4208 is of the form of a fine mesh which permits the air or water to pass through but does not permit the, passage of the hygroscopic material or the material 4207 that adsorbs oxygen. Provision of the hygroscopic material or the material 4207 capable of adsorbing oxygen suppresses the deterioration of the EL element 4303.

Referring to FIG. 17(C), the electrically conducting film 4203a is formed to come in contact onto the detouring wiring 4005a simultaneously with the formation of the pixel electrode 4203.

The anisotropic film 4300 has an electrically conducting filler 4300a. Upon thermally adhering the substrate 4001 and the FPC 4006 together, the electrically conducting film 4203a on the substrate 4001 and the wiring 4301 for FPC on the FPC 4006 are electrically connected together through the electrically conducting filler 4300a.

This embodiment can be carried out in free combination with the embodiments 1 to 5.

Embodiment 7

This embodiment deals with an example in which the TFT and the EL element are sealed on the substrate with a sealing member, and the substrate is replaced, while making a reference to FIG. 18 which is a sectional view illustrating the steps of fabricating the pixel unit.

Figure 18A:
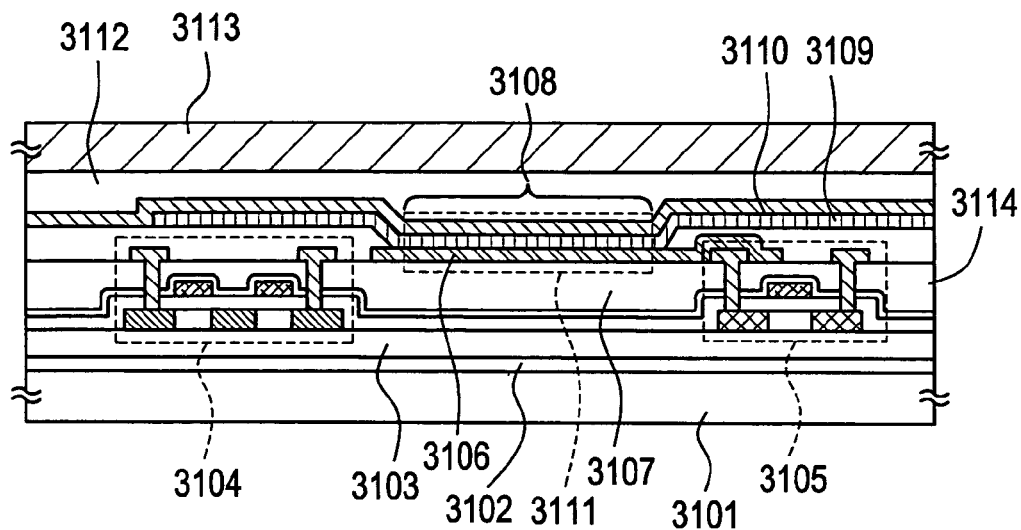
FIGS. 18(A) to 18(C) are diagrams illustrating the steps of fabricating the EL display device of this invention.

In FIG. 18(A), reference numeral 3101 is a substrate on which the elements are to be formed (hereinafter referred to as element-forming substrate) and on which a peeling layer 3102, which is an amorphous silicon film, is formed maintaining a thickness of 100 to 500 nm (300 nm in this embodiment). In this embodiment, a glass substrate is used as an element-forming substrate 3101. It is, however, also allowable to use a quartz substrate, a silicon substrate, a metal substrate (SUS substrate) or a ceramic substrate.

The peeling layer 3102 may be formed by a reduced pressure thermal CVD method, a plasma CVD method, a sputtering method or a vapor deposition method. On the peeling layer 3102 is formed an insulation film 3103 comprising a silicon oxide film maintaining a thickness of 200 nm. The insulating film 3103 may be formed by a reduced pressure thermal CVD method, a plasma CVD method, a sputtering method or a vapor deposition method.

On the insulating film 3103 are formed a switching TFT 3104 and an EL drive TFT 3105 of the pixel unit. Though this embodiment has dealt with an example in which the switching TFT 3104 is an n-channel TFT and the EL drive TFT 3105 is a p channel TFT, it should be noted that the embodiment is not limited to this constitution only. The switching TFT 3104 and the EL drive TFT 3105 may be either the p-channel TFTs or the n channel TFTs.

In this embodiment, further, the switching TFT 3104 has a double gate structure. However, the switching TFT is not limited to this structure only but may be of a single gate structure or of any other multi-gate structure. Upon employing the double gate structure as in this embodiment, the two channel-forming regions are connected in series making it possible to effectively suppress the off current (current that flows when the TFT is turned off).

The first interlayer insulating film 3107 is formed on the switching TFT 3104 and on the EL drive TFT 3105. The first interlayer insulating film 3107 is formed to cover the switching TFT 3104 and the EL drive TFT 3105, so that a pixel electrode 3106 that will be formed later will be flattened.

Further, the pixel electrode 3106 is so formed as is electrically connected to the drain region of the EL drive TFT 3105. In this embodiment, the pixel electrode 3106 is formed by patterning a transparent electrically conducting film (typically, a compound film of indium oxide and tin oxide) formed maintaining a thickness of 100 nm. The pixel electrode 3106 works as an anode of the EL element.

After the pixel electrode 3106 is formed, the second interlayer insulating film 3114, which is a silicon oxide film, is formed maintaining a thickness of 300 nm. Then, an opening 3108 is formed, followed by the formation of an EL layer 3109 maintaining a thickness of 70 nm and a cathode 3110 maintaining a thickness of 300 nm by vapor deposition method. This embodiment uses the EL layer 3109 of a structure laminating a positive hole-injection layer of a thickness of 20 nm and a light emitting layer of a thickness of 50 nm. It is of course allowable to use any other known structure combining the light emitting layer with a positive hole-injection layer, a positive hole-transporting layer, an electron-transporting layer or an electron-injection layer.

There is thus formed the EL element 3111 comprising the pixel electrode (anode) 3106, EL layer 3109 and cathode 3110. In this embodiment, the EL element 3111 works as a light emitting element.

Next, a substrate (hereinafter referred to as sealing member) 3113 is stuck for securing the element with a first adhesive 3112. In this embodiment, a flexible plastic film is used as the sealing member 3113. It is, however, also allowable to use a glass substrate, a quartz substrate, a plastic substrate, a silicon substrate or a ceramic substrate. The first adhesive 3112 must be the one that gives the selection ratio when the peeling layer 3102 is removed later.

Typically, there may be used an insulating film of a resin. Though this embodiment uses a polyimide, there may be further used an acrylic resin, a polyamide or an epoxy resin. When it is positioned on the side of the observer (on the side of the user of the light-emitting device) as viewed from the EL element, it must be made of a material that transmits light.

The EL element can be completely shut off the open air by the first adhesive 3112. This nearly completely suppresses the organic EL material from being deteriorated by oxygen, and reliability of the EL element is greatly improved.

Figure 18B:
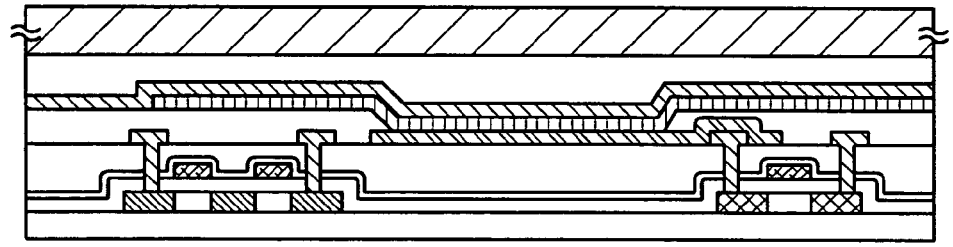

Referring next to FIG. 18(B), the peeling layer 3102 is removed, and the element-forming substrate 3101 and the insulating film 3103 are peeled off. In this embodiment, the peeling layer 3102 is exposed to a gas containing halogen fluoride and is peeled off. In this embodiment, chlorine trifluoride (ClF#(3)) is used as halogen fluoride and nitrogen is used as a dilution gas. As the dilution gas, there may be further used argon, helium or neon. The flow rate may be 500 sccm ($8.35\times10^{-6}$ m$^3$/s), and the reaction pressure may be 1 to 10 Torr ($1.3\times10^2$ to $1.3\times10^3$ Pa). The treating temperature may be room temperature (typically, 20 to 27° C.).

In this case, the silicon film is etched. However, the plastic film, glass substrate, polyimide film and silicon oxide film are not etched. That is, upon being exposed to the chlorine trifluoride gas, the peeling layer 3012 is selectively etched and is, then, completely removed. The active layer for the switching TFT 3104 and the EL drive TFT 3105, which is similarly formed of the silicon film, is covered with the first interlayer insulating film 3107 and is not exposed to the chlorine trifluoride gas and is not etched.

In the case of this embodiment, the peeling layer 3102 is gradually etched from the exposed end portion and at a moment when it is completely removed, the element-forming substrate 3101 and the insulating film 3103 are separated from each other. Here, the TFT and the EL element have been formed by laminating thin films, and remain in a form being transferred onto the sealing member 3113.

Here, the peeling layer 3102 starts etched from the end portion. As the element-forming substrate 3101 becomes large, however, an extended period of time is required until it is completely removed, which is not desirable. When removed by etching, therefore, the element-forming substrate 3101 should not have a diagonal size of larger than 3 inches (preferably, should not have a diagonal size of larger than 1 inch).

In this embodiment, the peeling layer 3102 is removed by etching in an atmosphere of a chlorine trifluoride gas. The embodiment, however, is not limited to this constitution only. The element-forming substrate 3101 may be peeled off by irradiating the peeling layer 3102 with a laser beam from the side of the element-forming substrate 3101 to vaporize the peeling layer 3102. In this case, the kind of the laser beam and the material of the element-forming substrate 3101 must be suitably selected so that the laser beam passes through the element-forming substrate 3101. When a quartz substrate is used as the element-forming substrate 3101, for example, a linear beam is formed by using a YAG laser (fundamental wave (1046 nm), second harmonic (532 nm), third harmonic (355 nm), fourth harmonic (266 nm)) or by using an excimer laser (wavelength 308 nm) which is projected to penetrate through the quartz substrate. The excimer laser does not pass through the glass substrate. When the glass substrate is used as the element forming substrate 3101, therefore, the linear beam is formed by using the fundamental wave of the YAG laser, second harmonic, or third harmonic or, preferably, second harmonic (wavelength, 532 nm) to penetrate through the glass substrate.

When the peeling is to be effected by using a laser beam, the peeling layer 3102 is formed of a material that vaporizes upon the irradiation with the laser beam.

In addition to using the laser beam, the element forming substrate 3101 may be peeled off by dissolving the peeling layer 3102 with a solution. In this case, it is desired to use such a solution which selectively dissolves the peeling layer 3102 only.

Figure 18C:
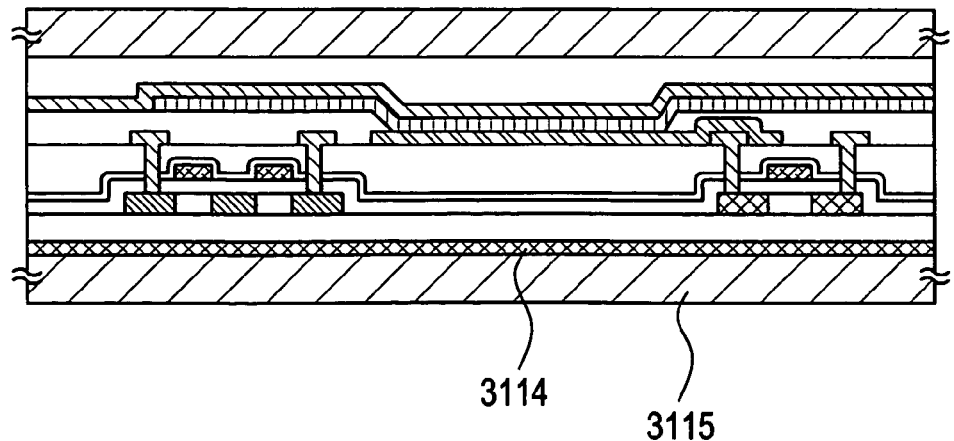

Thus, after the TFT and the EL element are transferred onto the sealing member 3113, a second adhesive 3114 is formed and to which a second element-forming substrate 3115 is stuck as shown in FIG. 18(C). As the second adhesive 3114, there may be used an insulating film of a resin (typically, a polyimide, an acrylic resin, a polyamide or an epoxy resin) or an inorganic insulating film (typically, a silicon oxide film). When it is positioned on the side of the observer as viewed from the EL element, it must be composed of a material that transmits light.

Thus, the TFT and the EL element are transferred from the element-forming substrate 3101 to the second element-forming substrate 3115. As a result, there is obtained an EL display device sandwiched between the sealing member 3113 and the second element-forming substrate 3115. Here, if the sealing member 3113 and the second element-forming substrate 3115 are formed of the same material, the coefficient of thermal expansion becomes the same, and the device receives little effect of stress and strain caused by a change in the temperature.

In the EL display device fabricated according to this embodiment, the materials of the sealing member 3113 and the material of the second element-forming substrate 3115 can be selected without the need of taking into consideration the heat resistance during the processing of the TFTs. For example, a plastic substrate can be used as the sealing member 3113 and as the second element-forming substrate 3115 to fabricate a flexible EL display device.

This embodiment can be carried out in free combination with the constitutions of the embodiments 1 to 6.

Embodiment 8

This embodiment deals with an example of forming a DLC film on the whole surfaces of the EL display device or on the end of the EL display device.

FIG. 19(A) is a sectional view of the EL display device having the DLC film formed on the whole surfaces thereof. A switching TFT 3205 and an EL drive TFT 3204 are formed on the substrate 3201. Reference numeral 3203 denotes an EL element, and a current that flows into the EL element 3203 is controlled by the EL drive TFT 3204.

The switching TFT 3205, EL drive TFT 3204 and EL element 3207 are sealed by a sealing member 3202 and a sealing member 3208, and are shut off from the external air. Reference numeral 3209 denotes a detour wiring exposed out of space in which the EL element 3207 is sealed, passing through between the sealing member 3208 and the substrate 3201.

Reference numeral 3210 denotes a DLC film covering the entire EL display device except a portion of the detour wiring 3209 that is exposed out of space in which the EL element 3203 is sealed.

In this embodiment, the DLC film may be formed by an ECR plasma CVD method, an RF plasma CVD method, a μ-wave plasma CVD method or a sputtering method. The DLC film has a feature in that it exhibits an asymmetrical peak near at 1550 cm$^{-1}$ and a Raman spectral distribution having a shoulder near 1300 cm$^{-1}$. It further has a feature of exhibiting a hardness of 15 to 25 GPa when measured by using a microhardness tester. Such a carbon film protects the surface of the substrate. In particular, since the plastic substrate easily gets scratched, covering the surface with the DLC film as shown in FIG. 19(A) is effective in preventing scars.

The DLC film is effective in preventing the infiltration of oxygen and water. In forming the DLC film 3210 so as to cover the sealing member 3208 as in this embodiment, therefore, it is allowed to prevent the matters that deteriorate the EL layer, such as water and oxygen, from entering into space in which the EL element 3204 is sealed.

In forming the DLC film 3210, further, part of the detour wiring 3209 exposed out of space in which the EL element 3203 is sealed, is covered with a resist mask which is then removed after the DLC film 3210 has been formed. Part of the detour wiring 3209 not covered with the DLC film 3210 is connected to the wiring 3211 for FPC provided in the FPC 3211 through an anisotropic electrically conducting film 3213.

FIG. 19(B) is a sectional view of the EL display device of when the DLC film is formed at an end of the EL display device. A switching TFT 3305 and an EL drive TFT 3304 are formed on a substrate 3301. Reference numeral 3303 denotes an EL element, and a current flowing into the EL element 3303 is controlled by the EL drive TFT 3304.

The switching TFT 3305, EL drive TFT 3304 and EL element 3303 are sealed by a sealing member 3302 and a sealing member 3308, and are shut off from the external air. Reference numeral 3309 denotes a detour wiring exposed out of space in which the EL element 3303 is sealed, passing through between the sealing member 3308 and the substrate 3301.

Reference numeral 3310 denotes a DLC film covering part of the sealing member 3302, part of the substrate 3301 and the sealing member 3308 except a portion of the detour wiring 3309 that is exposed out of space in which the EL element 3303 is sealed.

The DLC film 3310 is effective in preventing the infiltration of oxygen and water. In forming the DLC film 3310 so as to cover the sealing member 3308 as in this embodiment, therefore, it is allowed to prevent the matters that deteriorate the EL layer, such as water and oxygen, from entering into space in which the EL element 3303 is sealed.

The EL display device shown in FIG. 19(B) has the DLC film 3310 formed on the end (portion inclusive of the sealing member) only of the EL display device. Therefore, the DLC film 3310 can be easily formed.

In forming the DLC film 3310, further, part of the detour wiring 3309 exposed out of space in which the EL element 3303 is sealed, is covered with a resist mask which is then removed after the DLC film 3310 has been formed. Part of the detour wiring 3309 not covered with the DLC film 3310 is connected to the wiring 3311 for FPC provided in the FPC 3311 through an anisotropic electrically conducting film 3313.

This embodiment can be carried out in free combination with the constitutions of the embodiments 1 to 7.

Embodiment 9

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the EL display device in accordance with the present invention can be used as a display portion of an electro luminescence display device (i.e., a display in which an EL display device is installed into a frame) having a diagonal size of 30 inches or larger (typically 40 inches or larger.) The EL display device includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

As other electronic equipments of the present invention there are: a video camera; a digital camera; a goggle type display (head mounted display); a navigation system; a sound reproduction apparatus (a car audio stereo or an audio stereo and so forth); a notebook type personal computer; a game apparatus; a portable information terminal (such as a mobile computer, a mobile phone, a portable game machine, or an electronic book); and an image playback device equipped with a recording medium (specifically, device provided with a display portion which plays back images in a recording medium such as a digital versatile disk player (DVD), and displays the images). Specific examples of those electronic equipments are shown in FIGS. 12A to 13B.

Figure 12A:
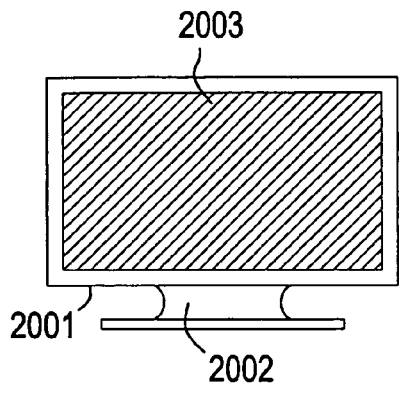
FIGS. 12(A) to 12(F) are views illustrating concrete examples of the electronic devices.

FIG. 12A shows an EL display device containing a casing 2001, a support stand 2002, and a display portion 2003. The EL display device of the present invention can be used as the display portion 2003. Such an EL display device is a self light emitting type so that a back light is not necessary. Thus, the display portion can be made thinner than that of a liquid crystal display.

Figure 12B:
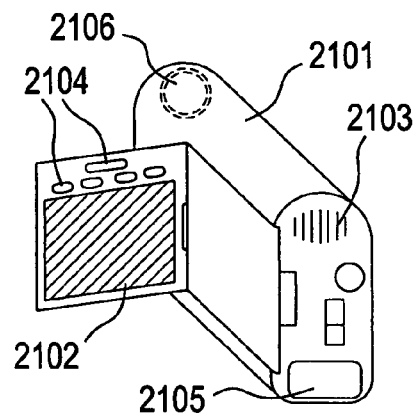

FIG. 12B shows a video camera, and contains a main body 2101, a display portion 2102, a sound input portion 2103, operation switches 2104, a battery 2105, and an image receiving portion 2106. The EL display device of the present invention can be used as the display portion 2102.

Figure 12C:
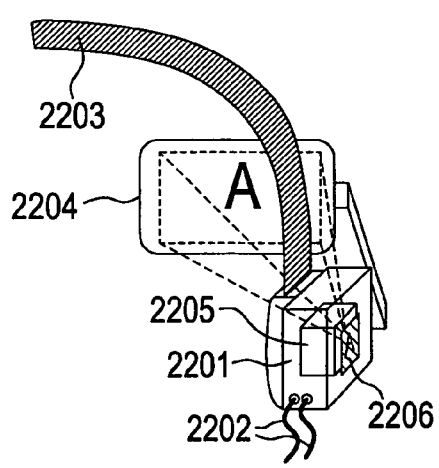

FIG. 12C illustrates a portion (the right-half piece) of a light-emitting device of head mount type, which includes a main body 2201, signal cables 2202, a head mount band 2203, a screen portion 2204, an optical system 2205, a display portion 2206, or the like. The EL display device of the present invention is applicable to the display portion 2206.

Figure 12D:
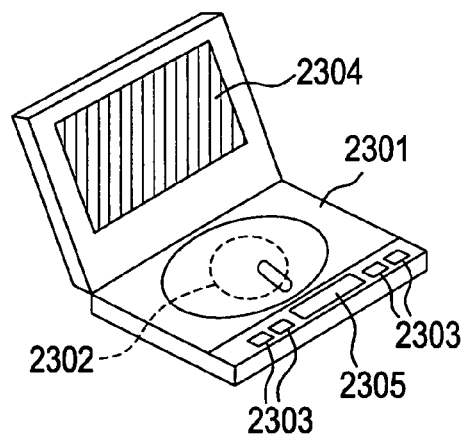

FIG. 12D is an image playback device equipped with a recording medium (specifically, a DVD playback device), and contains a main body 2301, a recording medium (such as a DVD and so forth) 2302, operation switches 2303, a display portion (a) 2304, and a display portion (b) 2305. The display portion (a) 2304 is mainly used for displaying image information. The display portion (b) 2305 is mainly used for displaying character information. The EL display device of the present invention can be used as the display portion (a) 2304 and as the display portion (b) 2305. Note that the image playback device equipped with the recording medium includes devices such as game machines.

Figure 12E:
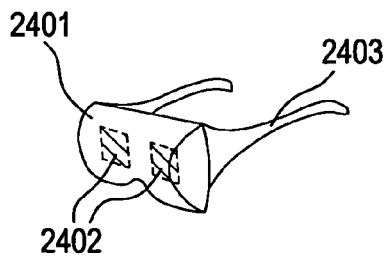

FIG. 12E shows a goggle type display (head mount display), and contains a main body 2401, a display portion 2402, and an arm portion 2403. The EL display device of the present invention is applicable to the display device 2402.

Figure 12F:
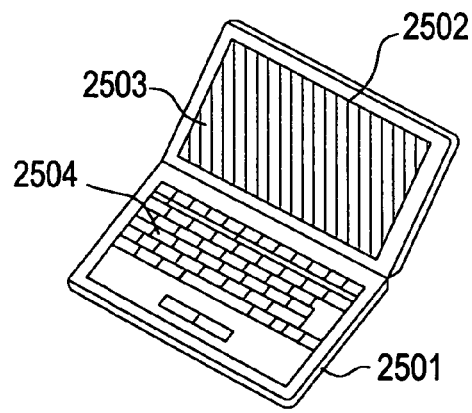

FIG. 12F is a personal computer, and contains a main body 2501, a casing 2502, a display portion 2503, and a keyboard 2504. The EL display device of the present invention can be used as the display portion 2503.

Note that if the luminance of the EL material increases in the future, then it will become possible to use the EL display device of the present invention in a front type or a rear type projector by expanding and projecting light containing output image information with a lens or the like.

Further, the above electric devices display often information transmitted through an electronic communication circuit such as the Internet and CATV (cable tv), and particularly situations of displaying moving images is increasing. The response speed of EL materials is so high that the above electric devices are good for display of moving image.

In addition, since the EL display device conserves power in the light emitting portion, it is preferable to display information so as to make the light emitting portion as small as possible. Consequently, when using the light emitting device in a display portion mainly for character information, such as in a portable information terminal, in particular a portable telephone or an audio stereo, it is preferable to drive the EL display device so as to form character information by the light emitting portions while non-light emitting portions are set as background.

Figure 13A:
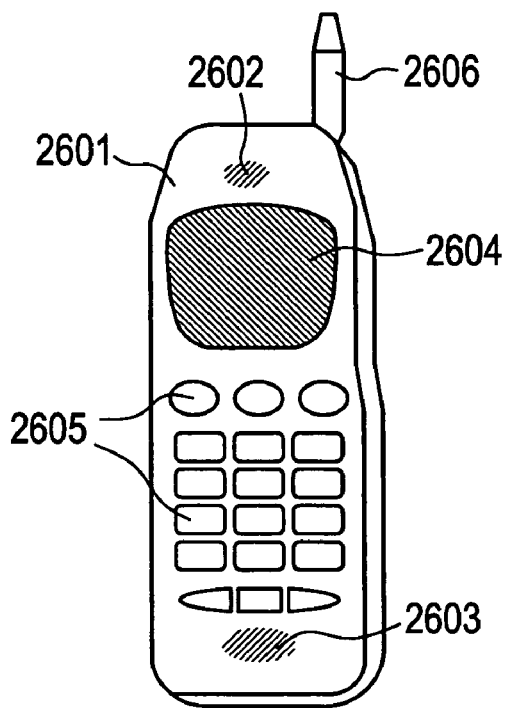
FIGS. 13(A) and 13(B) are views illustrating concrete examples of the electronic devices.

FIG. 13A shows a portable telephone, and contains a main body 2601, a sound output portion 2602, a sound input portion 2603, a display portion 2604, operation switches 2605, and an antenna 2606. The EL display device of the present invention can be used as the display portion 2604. Note that by displaying white color characters in a black color background, the display portion 2604 can suppress the power consumption of the portable telephone.

Figure 13B:
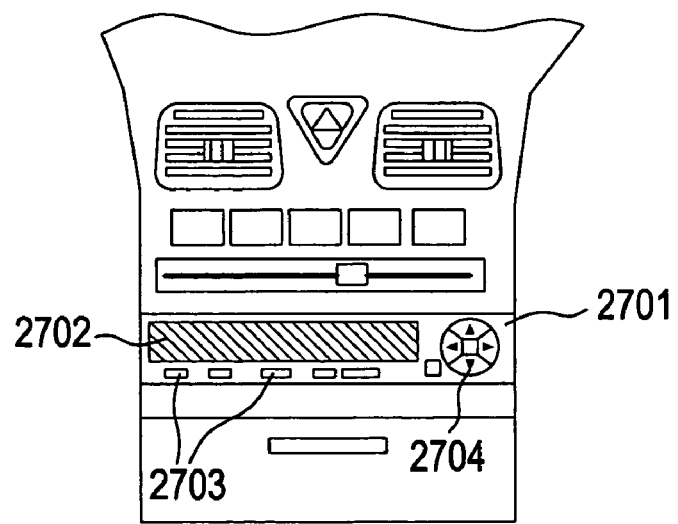
Figure 14A:
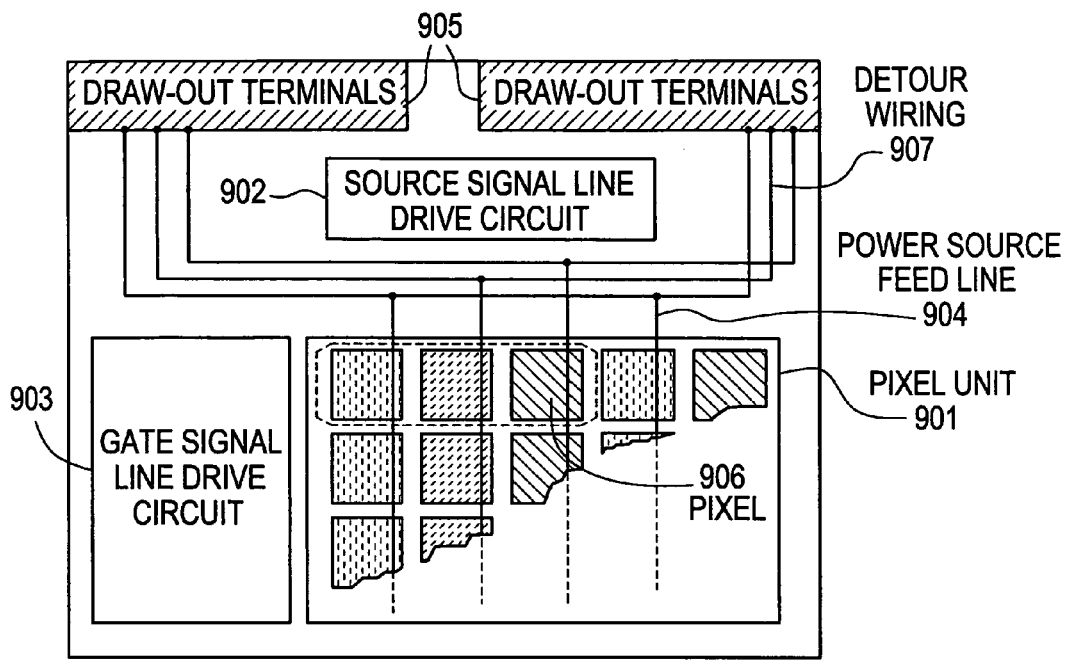
FIGS. 14(A) and 14(B) are diagrams illustrating the constitution of a conventional EL display device.
Figure 14B:
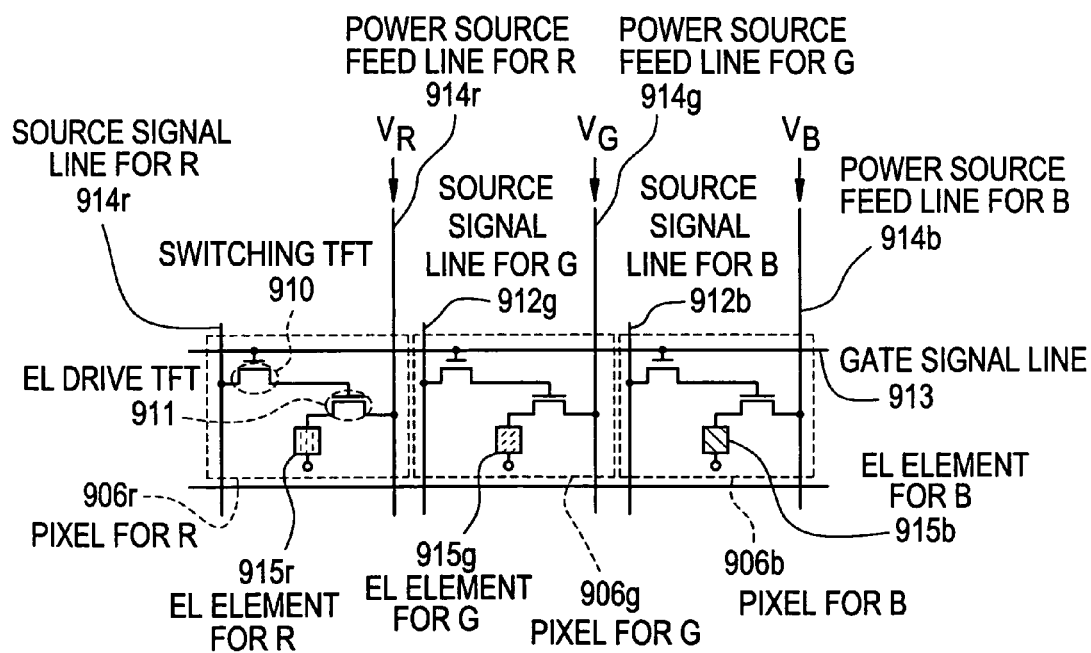
Figure 15:
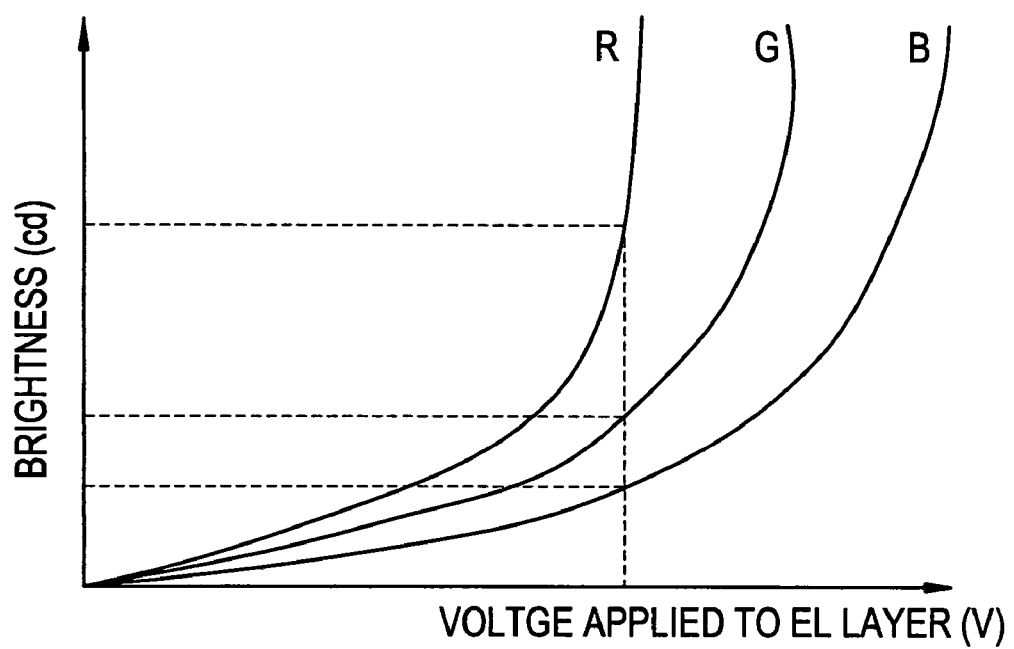
FIG. 15 is a diagram illustrating voltage—brightness characteristics of an organic EL material.

FIG. 13B shows a sound reproduction device, in a concrete term, car audio stereo, and contains a main body 2701, a display portion 2702, and operation switches 2703 and 2704. The EL display device of the present invention can be used as the display portion 2702. Further, a car mounting audio stereo is shown in this embodiment, but a portable type or domestic type audio playback device may also be used. Note that, by displaying white color characters in a black color background, the display portion 2702 can suppress the power consumption. It is especially effective for a portable sound reproduction device.

As described above, the application range of this invention is extremely wide, and it may be used for electric devices in various fields. Further, the electric device of this embodiment may be obtained by using an EL display device freely combining the structures of the first to eighth embodiments.

The constitution of this invention makes it possible to maintain a balance of light-emitting brightnesses of the pixels R, G and B irrespective of the number of pixels that produce the white display.

In this embodiment, further, the amplitude of the video signals may be increased for those pixels in which a large voltage is applied to the EL element. Owing to the above constitution, the off current of the EL drive TFT is prevented from increasing when the voltage of the power source feed lines is elevated.

At the same time, the channel width (W) may be increased for the EL drive TFTs of the pixels to which are connected the power source feed lines having a large absolute current value. The above-mentioned constitution of the invention works to suppress the deterioration of the EL drive TFTs even when the current for controlling the EL drive TFTs is increased due to an increase in the absolute current value that flows through the power source feed lines. The light-emitting brightness of the EL element is adjusted relying upon the voltage applied to the EL elements, and a picture of vivid colors is displayed maintaining a good balance in the light emitting brightnesses of red color, blue color and green color.

What is claimed is:

1. An EL display device comprising:
    a substrate;
    a pixel portion comprising:
        a first EL element over the substrate, comprising a first pixel electrode;
        a second EL element over the substrate, comprising a second pixel electrode;
        a first TFT over the substrate;
        a second TFT over the substrate;
        a first power supply line over the substrate electrically connected to the first pixel electrode via the first TFT;
        a second power supply line over the substrate electrically connected to the second pixel electrode via the second TFT;
    a first detour wiring configured to supply a first current to the first power supply line, and not to supply the first current to the second power supply line; and
    a second detour wiring configured to supply a second current to the second power supply line, and not to supply the second current to the first power supply line,
    wherein a current density of the first EL element is larger than a current density of the second EL element,
    wherein a width of the first detour wiring is larger than a width of the second detour wiring, and wherein a part of the first detour wiring and the second detour wiring is arranged in the periphery of the pixel portion.

2. An EL display device according to claim 1, wherein a width of the first power supply line is different from a width of the second power supply line.

3. An EL display device according to claim 1, wherein a color of light emitted by the first EL element is different from a color of light emitted by the second EL element.

4. An EL display device according to claim 1, wherein a channel width of the first TFT is different from a channel width of the second TFT.

5. A camera comprising:
a substrate;
a pixel unit comprising:
 a first EL element over the substrate, comprising a first pixel electrode;
 a second EL element over the substrate, comprising a second pixel electrode;
 a first TFT over the substrate;
 a second TFT over the substrate;
 a first power supply line over the substrate electrically connected to the first pixel electrode via the first TFT;
 a second power supply line over the substrate electrically connected to the second pixel electrode via the second TFT;
a first detour wiring configured to supply a first current to the first power supply line, and not to supply the first current to the second power supply line; and
a second detour wiring configured to supply a second current to the second power supply line, and not to supply the second current to the first power supply line,
wherein a current density of the first EL element is larger than a current density of the second EL element,
wherein a width of the first detour wiring is larger than a width of the second detour wiring, and
wherein a part of the first detour wiring and the second detour wiring is arranged in the periphery of the pixel unit.

6. A camera according to claim 5, wherein a width of the first power supply line is different from a width of the second power supply line.

7. A camera according to claim 5, wherein a color of light emitted by the first EL element is different from a color of light emitted by the second EL element.

8. A camera according to claim 5, wherein a channel width of the first TFT is different from a channel width of the second TFT.

9. An image playback device comprising:
a substrate;
a pixel unit comprising:
a first EL element over the substrate, comprising a first pixel electrode;
 a second EL element over the substrate, comprising a second pixel electrode;
 a first TFT over the substrate;
 a second TFT over the substrate;
 a first power supply line over the substrate electrically connected to the first pixel electrode via the first TFT;
 a second power supply line over the substrate electrically connected to the second pixel electrode via the second TFT;
a first detour wiring configured to supply a first current to the first power supply line, and not to supply the first current to the second power supply line; and
a second detour wiring configured to supply a second current to the second power supply line, and not to supply the second current to the first power supply line,
wherein a current density of the first EL element is larger than a current density of the second EL element,
wherein a width of the first detour wiring is larger than a width of the second detour wiring, and
wherein a part of the first detour wiring and the second detour wiring is arranged in the periphery of the pixel unit.

10. An image playback device according to claim 9, wherein a width of the first power supply line is different from a width of the second power supply line.

11. An image playback device according to claim 9, wherein a color of light emitted by the first EL element is different from a color of light emitted by the second EL element.

12. An image playback device according to claim 9, wherein a channel width of the first TFT is different from a channel width of the second TFT.

13. A personal computer comprising:
a substrate;
a pixel unit comprising:
 a first EL element over the substrate, comprising a first pixel electrode;
 a second EL element over the substrate, comprising a second pixel electrode;
 a first TFT over the substrate;
 a second TFT over the substrate;
 a first power supply line over the substrate electrically connected to the first pixel electrode via the first TFT;
 a second power supply line over the substrate electrically connected to the second pixel electrode via the second TFT;
a first detour wiring configured to supply a first current to the first power supply line, and not to supply the first current to the second power supply line; and
a second detour wiring configured to supply a second current to the second power supply line, and not to supply the second current to the first power supply line,
wherein a current density of the first EL element is larger than a current density of the second EL element,
wherein a width of the first detour wiring is larger than a width of the second detour wiring, and
wherein a part of the first detour wiring and the second detour wiring is arranged in the periphery of the pixel unit.

14. A personal computer according to claim 13, wherein a width of the first power supply line is different from a width of the second power supply line.

15. A personal computer according to claim 13, wherein a color of light emitted by the first EL element is different from a color of light emitted by the second EL element.

16. A personal computer according to claim 13, wherein a channel width of the first TFT is different from a channel width of the second TFT.

17. A portable telephone comprising:
a substrate;
a pixel unit comprising:
 a first EL element over the substrate, comprising a first pixel electrode;
 a second EL element over the substrate, comprising a second pixel electrode;
 a first TFT over the substrate;
 a second TFT over the substrate;
 a first power supply line over the substrate electrically connected to the first pixel electrode via the first IFT;

a second power supply line over the substrate electrically connected to the second pixel electrode via the second TFT;

a first detour wiring configured to supply a first current to the first power supply line, and not to supply the first current to the second power supply line; and a second detour wiring configured to supply a second current to the second power supply line, and not to supply the second current to the first power supply line, wherein a current density of the first EL element is larger than a current density of the second EL element, wherein a width of the first detour wiring is larger than a width of the second detour wiring, and wherein a part of the first detour wiring and the second detour wiring is arranged in the periphery of the pixel unit.

18. A portable telephone according to claim 17, wherein a width of the first power supply line is different from a width of the second power supply line.

19. A portable telephone according to claim 17, wherein a color of light emitted by the first EL element is different from a color of light emitted by the second EL element.

20. A portable telephone according to claim 17, wherein a channel width of the first TFT is different from a channel width of the second IFT.

21. An EL display device comprising:
a substrate;
a pixel unit comprising:
a first EL element over the substrate, comprising a first pixel electrode;
a second EL element over the substrate, comprising a second pixel electrode;
a first TFT over the substrate;
a second TFT over the substrate;
a first power supply line over the substrate electrically connected to the first pixel electrode via the first TFT;
a second power supply line over the substrate electrically connected to the second pixel electrode via the second TFT;
a first detour wiring configured to supply a first current to the first power supply line, and not to supply the first current to the second power supply line; and
a second detour wiring configured to supply a second current to the second power supply line, and not to supply the second current to the first power supply line,
wherein a current density of the first EL element is larger than a current density of the second EL element,
wherein a width of the first power supply line is larger than a width of the second power supply line, and
wherein a part of the first detour wiring and the second detour wiring is arranged in the periphery of the pixel unit.

22. An EL display device according to claim 21, wherein a color of light emitted by the first EL element is different from a color of light emitted by the second EL element.

23. An EL display device according to claim 21, wherein a channel width of the first TFT is different from a channel width of the second TFT.

24. A camera comprising:
a substrate;
a pixel unit comprising:
a first EL element over the substrate, comprising a first pixel electrode;
a second EL element over the substrate, comprising a second pixel electrode;
a first TFT over the substrate;
a second TFT over the substrate;
a first power supply line over the substrate electrically connected to the first pixel electrode via the first IFT;
a second power supply line over the substrate electrically connected to the second pixel electrode via the second TFT;
a first detour wiring configured to supply a first current to the first power supply line, and not to supply the first current to the second power supply line; and
a second detour wiring configured to supply a second current to the second power supply line, and not to supply the second current to the first power supply line,
wherein a current density of the first EL element is larger than a current density of the second EL element,
wherein a width of the first power supply line is larger than a width of the second power supply line, and
wherein a part of the first detour wiring and the second detour wiring is arranged in the periphery of the pixel unit.

25. A camera according to claim 24, wherein a color of light emitted by the first EL element is different from a color of light emitted by the second EL element.

26. A camera according to claim 24, wherein a channel width of the first TFT is different from a channel width of the second TFT.

* * * * *